(12) United States Patent
Fujita

(10) Patent No.: US 10,283,049 B2
(45) Date of Patent: May 7, 2019

(54) ELECTRO-OPTICAL DEVICE AND ELECTRONIC APPARATUS

(71) Applicant: SEIKO EPSON CORPORATION, Tokyo (JP)

(72) Inventor: Shin Fujita, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/044,549

(22) Filed: Jul. 25, 2018

(65) Prior Publication Data

US 2018/0330661 A1     Nov. 15, 2018

Related U.S. Application Data

(62) Division of application No. 15/921,970, filed on Mar. 15, 2018, now Pat. No. 10,062,329, which is a (Continued)

(30) Foreign Application Priority Data

Mar. 10, 2011    (JP) .................................. 2011-053562

(51) Int. Cl.
     *G09G 3/36*          (2006.01)
     *H01L 27/13*       (2006.01)
     (Continued)

(52) U.S. Cl.
     CPC ......... *G09G 3/3233* (2013.01); *G09G 3/3266* (2013.01); *G09G 3/3283* (2013.01);
     (Continued)

(58) Field of Classification Search
None
See application file for complete search history.

(56) References Cited

U.S. PATENT DOCUMENTS 7,057,588 B2    6/2006   Asano et al.
7,109,952 B2    9/2006   Kwon
(Continued)

FOREIGN PATENT DOCUMENTS

CN          101595567 A      12/2009
EP           1 505 650 A3      8/2005
(Continued)

OTHER PUBLICATIONS

Jun. 6, 2012 Search Report issued in European Patent Application No. 12158563.2.

(Continued)

*Primary Examiner* — Carl Adams
(74) *Attorney, Agent, or Firm* — Oliff PLC

(57) ABSTRACT

An electro-optical device includes a scanning line, a data line intersecting with each other, a pixel circuit which is provided corresponding to the intersection thereof, and a wire. The pixel circuit includes a light emitting element, one transistor which controls a current flowing to the light emitting element, and the other transistor of which conduction state is controlled according to a scanning signal which is supplied to the scanning line between a gate node of the one transistor and the data line. The wire is provided between the data line and the one transistor.

6 Claims, 19 Drawing Sheets

Related U.S. Application Data division of application No. 15/267,975, filed on Sep. 16, 2016, now Pat. No. 9,953,572, which is a division of application No. 13/415,378, filed on Mar. 8, 2012, now abandoned.

(51) Int. Cl.

| | | |
|---|---|---|
| *G09G 3/3233* | (2016.01) | |
| *G09G 3/3266* | (2016.01) | |
| *G09G 3/3283* | (2016.01) | |
| *H01L 27/12* | (2006.01) | |
| *H01L 27/32* | (2006.01) | |

(52) U.S. Cl.
CPC ............... *G09G 2300/043* (2013.01); *G09G 2300/0426* (2013.01); *G09G 2300/0809* (2013.01); *G09G 2320/0209* (2013.01); *G09G 2330/06* (2013.01); *H01L 27/124* (2013.01); *H01L 27/1255* (2013.01); *H01L 27/3262* (2013.01); *H01L 27/3265* (2013.01); *H01L 27/3272* (2013.01); *H01L 27/3276* (2013.01)

(56) References Cited

U.S. PATENT DOCUMENTS

| | | | |
|---|---|---|---|
| 7,768,485 | B2 | 8/2010 | Uchino et al. |
| 2002/0113929 | A1 | 8/2002 | Yamazaki et al. |
| 2004/0145541 | A1 | 7/2004 | Iki et al. |
| 2004/0179005 | A1 | 9/2004 | Jo |
| 2004/0263710 | A1 | 12/2004 | Song et al. |
| 2005/0179680 | A1 | 8/2005 | Makino |
| 2005/0179682 | A1 | 8/2005 | Shin et al. |
| 2005/0206590 | A1 | 9/2005 | Sasaki et al. |
| 2006/0145960 | A1 | 7/2006 | Koga et al. |
| 2007/0290974 | A1 | 12/2007 | Huang et al. |
| 2008/0049007 | A1 | 2/2008 | Iida et al. |
| 2008/0239177 | A1* | 10/2008 | Sekine ............... G09G 3/003 349/15 |
| 2009/0009441 | A1 | 1/2009 | Yamamoto et al. |
| 2009/0167645 | A1 | 7/2009 | Kishi |
| 2009/0315854 | A1 | 12/2009 | Matsuo |
| 2010/0079419 | A1 | 4/2010 | Shibusawa |
| 2010/0176381 | A1 | 7/2010 | Yagi et al. |
| 2010/0176400 | A1* | 7/2010 | Asano ............... G09G 3/3233 257/59 |
| 2011/0298785 | A1 | 12/2011 | Al-Dahle et al. |

FOREIGN PATENT DOCUMENTS

| | | |
|---|---|---|
| JP | 2003-271095 A | 9/2003 |
| JP | 2004-029791 A | 1/2004 |
| JP | 2004-133240 A | 4/2004 |
| JP | 2006-030635 A | 2/2006 |
| JP | 2006-113110 A | 4/2006 |
| JP | 2007-310311 A | 11/2007 |
| JP | 2009-109853 A | 5/2009 |
| WO | 2008/004348 A1 | 1/2008 |

OTHER PUBLICATIONS

Jan. 6, 2014 Office Action issued in U.S. Appl. No. 13/415,378.
Aug. 13, 2014 Office Action issued in U.S. Appl. No. 13/415,378.
Jan. 29, 2015 Office Action issued in U.S. Appl. No. 13/415,378.
May 7, 2015 Office Action issued in U.S. Appl. No. 13/415,378.
Oct. 22, 2015 Office Action issued in U.S. Appl. No. 13/415,378.
Jan. 14, 2016 Office Action issued in U.S. Appl. No. 13/415,378.
Jun. 16, 2016 Office Action issued in U.S. Appl. No. 13/415,378.
Apr. 7, 2017 Office Action issued in U.S. Appl. No. 15/267,975.
Sep. 5, 2017 Office Action issued in U.S. Appl. No. 15/267,975.
Dec. 15, 2017 Notice of Allowance issued in U.S. Appl. No. 15/267,975.
May 2, 2018 Notice of Allowance issued in U.S. Appl. No. 15/921,970.

\* cited by examiner

<IMAGE TO BE DISPLAYED>

<IMAGE DISPLAYED IN PRACTICE>

ELECTRO-OPTICAL DEVICE AND ELECTRONIC APPARATUS

This is a divisional application of application Ser. No. 15/921,970, filed Mar. 15, 2018, which is a divisional application of application Ser. No. 15/267,975, filed Sep. 16, 2016, which is a divisional application of application Ser. No. 13/415,378 filed Mar. 8, 2012, which claims priority to JP 2011-053562 filed Mar. 10, 2011, the disclosures of which are hereby incorporated by reference herein their entirety.

BACKGROUND

1. Technical Field

The present invention relates to an electro-optical device and an electronic apparatus.

2. Related Art

In recent years, various electro-optical devices in which a light emitting element such as an Organic Light Emitting Diode (hereinafter, referred to as "OLED") is used have been proposed. In such an electro-optical device, a pixel circuit is provided corresponding to the intersection of a scanning line and a data line. In general, the pixel circuit includes the above described light emitting element, a switching transistor, and a driving transistor (refer to JP-A-2007-310311). Here, the switching transistor is turned on in a selection period of the scanning line, between the data line and a gate of the driving transistor, and in this manner, an electric potential which is supplied to the data line is held in the gate. In addition, the driving transistor is configured to flow a current corresponding to a holding potential of the gate to the light emitting element.

Meanwhile, in a usage in which miniaturization of the size of a display and higher resolution of the display are necessary, the data line and the driving transistor are close to each other, and the degree of capacitative coupling is increased. For this reason, when there is potential fluctuation of the data line, the potential fluctuation propagates to each portion of the driving transistor, especially to the gate as a kind of noise, through parasitic capacitance, and causes the holding potential of the gate to fluctuate. Accordingly, there was a problem in that the display quality is degraded, since it was not possible to flow a desired current to the light emitting element.

SUMMARY

An advantage of some aspects of the invention is to prevent the display quality from being degraded due to noise which is caused by the potential fluctuation of the data line.

According to an aspect of the invention, there is provided an electro-optical device which includes, scanning lines and data lines which intersect with each other, pixel circuits which are provided corresponding to the intersection of the scanning lines and the data lines; and a shield wires, wherein each of the pixel circuit includes a light emitting element, a driving transistor which controls a current flowing to the light emitting element, and a switching transistor which is connected between a gate of the driving transistor and the data line, and of which conduction state is controlled according to a scanning signal which is supplied to the scanning line, and wherein each of the shield wires is provided between the data line and the driving transistor when seen in the plan view.

According to the aspect of the invention, the noise which is generated from the data line is absorbed by the shield wire before reaching the driving transistor of the pixel circuit. For this reason, the driving transistor is hardly influenced by noise or the like, therefore, it is possible to prevent the display quality from being degraded.

According to the aspect of the invention, it is preferable that the distance between the shield wire and the data line be shorter than the distance between the shield wire and the driving transistor. According to the aspect, it is possible to more reliably suppress the influence by the noise or the like.

According to the aspect of the invention, regarding the shield wire, even if it is in a high impedance state (floating) which is not electrically connected to a certain portion, it is possible to absorb the noise, for example, when capacitative coupling is performed to a electric supply line of a constant potential in time, however, it is preferable that be directly connected to the constant potential in time. In this configuration, in the pixel circuit, the light emitting element and the driving transistor are connected to each other in series in a path between the power line on the high side and the power line on the low side, and if the shield wire is connected to the high side power line, or to the low side power line, it is sufficient if it is connected to an existing power line.

In addition, in such a configuration, in the pixel circuit, if the shield wire has a portion which is connected to the high side power line or the low side power line, it is possible to more reliably absorb the noise, since the shield wire can be made to have low impedance.

Further, according to the aspect of the invention, it is preferable to have a holding capacity of which one end is electrically connected to the gate of the driving transistor. In this configuration, if the shield wire is set to cover the holding capacity when seen in the plan view, it is possible to make a holding voltage due to the holding capacity difficult to be influenced by noise.

In addition, according to another aspect of the invention, there is provided an electro-optical device which includes, scanning lines and data lines which intersect with each other; pixel circuits which are provided corresponding to each the intersection of the scanning lines and the data lines; and shield wires, wherein each of the pixel circuit includes a light emitting element, a driving transistor which controls a current flowing to the light emitting element, and a switching transistor which is connected between a gate of the driving transistor and the data line, and of which conduction state is controlled according to a scanning signal which is supplied to the scanning line, and wherein the shield wire is provided between the data line and the driving transistor in the cross-sectional view, and may be obtained by a configuration in which the shield wire is overlapped with at least a part of the data line or the driving transistor when seen in the plan view.

In addition, the electro-optical device according to the aspect of the invention may be applied to various electronic apparatuses. Typically, they are display devices, and as an electronic apparatus, for example, there is a personal computer or a mobile phone. Especially, in the application, even when the holding capacity is not sufficiently secure, the noise from the data line is absorbed to the shield wire before reaching the driving transistor of the pixel circuit, and due to this, it is possible to prevent the quality of the display from being degraded. Accordingly, for example, it is preferable to be applied to a display device which forms a reduced image such as a display device for a head-mounted display or a projector. The usage of the electro-optical device according to the aspect of the invention is not limited to the display device. For example, it may be applied to an exposure device (optical head), as well, which forms a latent image on an image carrier such as a photoconductive drum by irradiating a light beam.

BRIEF DESCRIPTION OF THE DRAWING

The invention will be described with reference to the accompanying drawings, wherein like numbers reference like elements.

DETAILED DESCRIPTION OF EMBODIMENTS

First Embodiment

Figure 1:
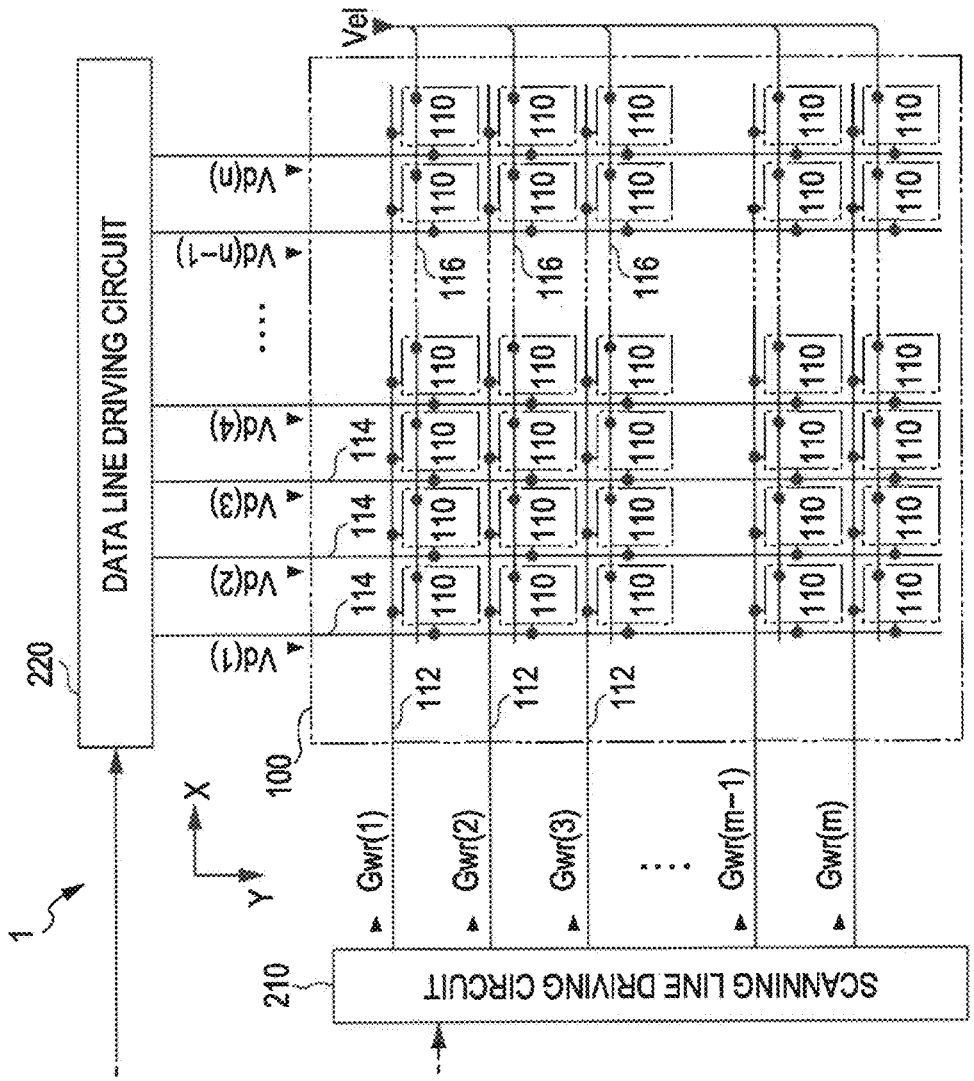
FIG. 1 is a block diagram which shows a configuration of an electro-optical device according to a first embodiment of the invention.

FIG. 1 is a block diagram which shows a configuration of an electro-optical device according to a first embodiment of the invention. The electro-optical device 1 is a device for displaying an image using a plurality of pixel circuits 110.

As shown in the drawing, the electro-optical device 1 includes an element unit 100, a scanning line driving circuit 210 and a data line driving circuit 220.

Among these, in the element unit 100, m rows of scanning lines 112 are provided in the row (X) direction, and n columns of data lines 114 are provided in the column (Y) direction in the drawing so as to maintain electrical insulation with respect to each of the scanning lines 112, each other. The pixel circuit 110 is respectively arranged corresponding to each intersection between the m rows of scanning lines 112 and the n columns of data lines 114. Accordingly, in the embodiment, the pixel circuit 110 is arranged in matrix of vertical m rows×horizontal n columns. In addition the number m and n are all natural numbers.

Respective power lines 116 are commonly connected to each of the pixel circuits 110, and a potential Vel on the high side of device power is supplied thereto. In addition, although omitted in FIG. 1, as will be described later, a common electrode is provided over each of the pixel circuits 110, and a potential Vct on the low side of the device power is supplied thereto. These potentials Vel and Vct are generated by a power supply circuit which is not shown.

In addition, in order to distinguish the row of the scanning line 112 from the row of the pixel circuit 110 conveniently, there may be a case where the rows are called sequentially from above a first row, a second row, a third row, . . . , (m−1)th row, and mth row in FIG. 1. Similarly, in order to conveniently distinguish the column of the data line 114 from the column of the pixel circuit 110, there may be a case where the columns are called sequentially from above a first column, a second column, a third column, . . . , (n−1)th column and nth column in FIG. 1.

In the electro-optical device 1, the scanning line driving circuit 210 and the data line driving circuit 220 are arranged in the vicinity of a region where the pixel circuits 110 are arranged in matrix. The operations of the scanning line driving circuit 210 and the data line driving circuit 220 are controlled by a controller which is not shown. In addition, gray scale data which designates gray scale (brightness) to be expressed in each of the pixel circuits 110 is supplied to the data driving circuit 220 from the controller.

The scanning line driving circuit 210 is a circuit which sequentially selects the row of scanning lines 1 to m in each frame. For example, the scanning line driving circuit 210 is the circuit which supplies respective scanning signals of Gwr (1), Gwr (2), Gwr (3), . . . , Gwr (m−1), Gwr(m) to the scanning lines of the first row, the second row, the third row, . . . , (m−1)th row, and mth row, and sequentially sets each of the scanning lines in the frame to H level, exclusively. In this description, the frame means the time period which is necessary to display an image of one cut (frame) in the electro-optical device 1, and if the vertical scan frequency is 60 Hz, it is a time period of 16.67 milliseconds of one cycle thereof.

The data line driving circuit 220 is a circuit which supplies a data signal of a potential corresponding to the gray scale data of the pixel circuit 110, with respect to the pixel circuit 110 which is positioned on a row which is selected by the scanning line driving circuit 210, through the data line 114. For the sake of convenience, the data signals which are respectively supplied to the data lines 114 of the first column, a second column, a third column, . . . , (n−1)th column and nth column are denoted by Vd (1), Vd (2), Vd (3), . . . , Vd (n−1), and Vd (n).

Subsequently, the equivalent circuit of the pixel circuit 110 will be described with reference to FIG. 2. In addition, in FIG. 2, pixel circuits 110 are shown arranged 2×2 for a total of four pixels, which corresponds to intersections of the scanning lines 112 of ith row and (i+1)th row which neighbors the ith row from below, and the data lines 114 of jth column and (j+1)th column which neighbors the jth column on the right. Here, the i and (i+1) are symbols which are used when generally showing the columns in which the pixel circuits 110 are arranged, and the symbols are integers of equal to 1 or more and equal to n or less. Similarly, the j and (j+1) are symbols which are used when generally showing the columns in which the pixel circuits 110 are arranged, and the symbols are integers of equal to 1 or more and equal to n or less.

Figure 2:
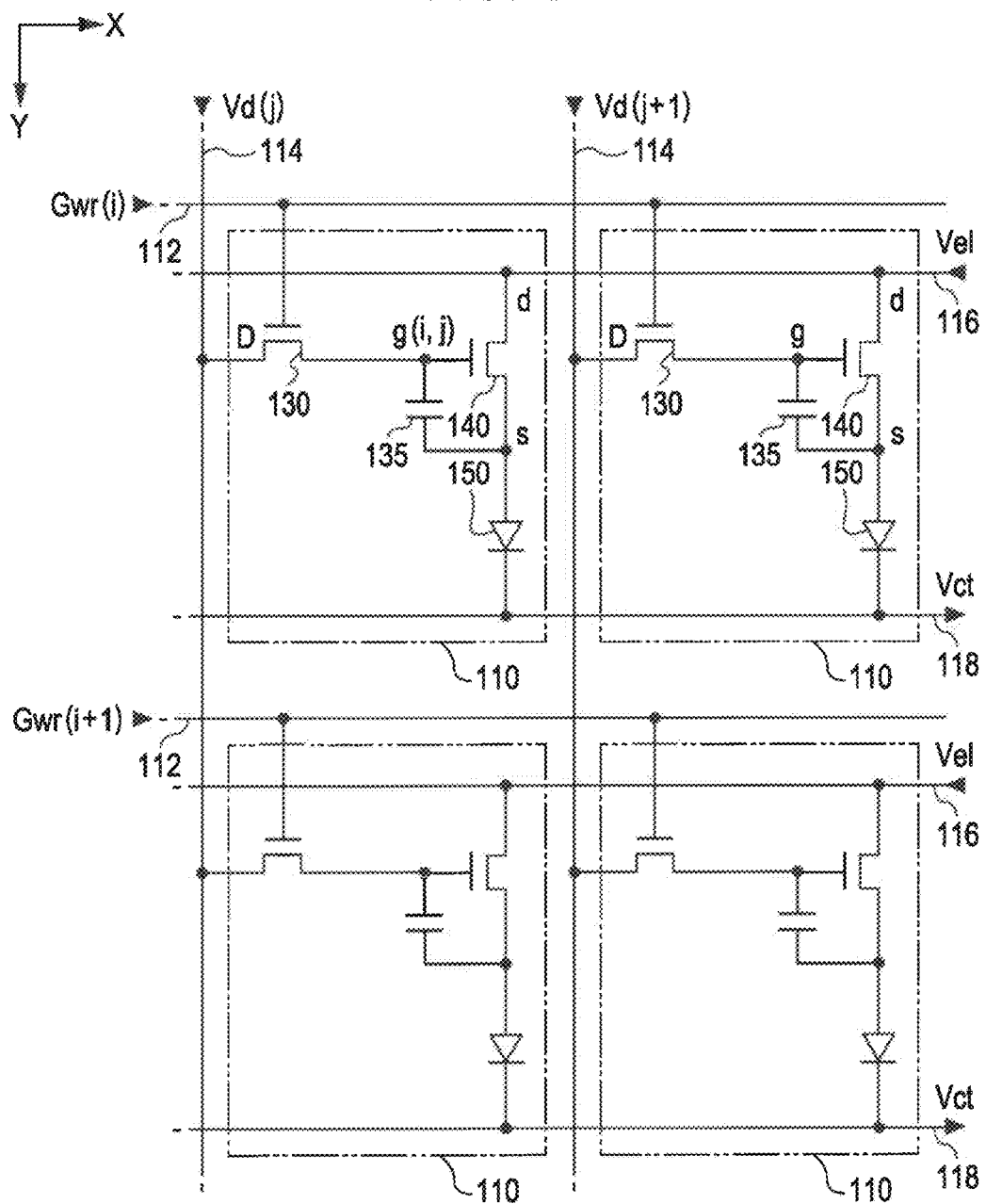
FIG. 2 is a diagram which shows an equivalent circuit of a pixel circuit in the electro-optical device.

As shown in FIG. 2, each pixel circuit 110 includes transistors 130 and 140 of N-channel-type, a holding capacity 135, and a light emitting element 150. Since each of the pixel circuits 110 has the same configuration as each other, the pixel circuit on the ith row and the jth column will be representatively described. In the pixel circuit on the ith row and the jth column, the transistor 130 functions as a switching transistor, and a gate node thereof is connected to the scanning line 112 on the ith row. On the other hand, a drain node thereof is connected to the data line 114 on the jth column, and a source node thereof is connected to one end of the holding capacity 135, and to a gate node of the transistor 140, respectively.

The other end of the holding capacity 135 is connected to a source node of the transistor 140 and an anode of the light emitting element 150, respectively. On the other hand, a drain node of the transistor 140 is connected to the power supply line 116.

For the sake of convenience, in the pixel circuit 110 of ith row and jth column, the drain node of the transistor 130 is denoted by a capital letter of D, the gate node of the transistor 140 (a source node of the transistor 130 and one end of the holding capacity 135) is denoted by a small letter g. Particularly, the gate node of the transistor 140 on the ith row and jth column is denoted by g(i, j).

In addition, the drain node (power supply line 116) of the transistor 140 is denoted by a small letter d, and a source node of the transistor 140 (an anode of the light emitting element 150) is denoted by a small letter s.

The cathode of the light emitting element 150 is connected to a common electrode 118 in each of the pixel circuits 100. The common electrode 118 is common to the light emitting element 150 of each pixel circuit 110. The light emitting element 150 is an OLED which interposes a light-emitting layer which is formed of an organic EL material, between the anode and cathode which face each other. The light emitting element emits light with a brightness which corresponds to a current which flows from the anode toward the cathode.

In addition, in FIG. 2, Gwr (i) and Gwr (i+1) denote scanning signals which are respectively supplied to scanning lines 112 of ith row and (i+1)th row. Further, Vd (j) and Vd (j+1) denote data signals which are respectively supplied to data lines 114 of jth column and (j+1)th column.

In addition, according to the embodiment, a shield wire is provided in the vicinity of the data line 114, however, the shield wire will be described in detail later.

Figure 3:
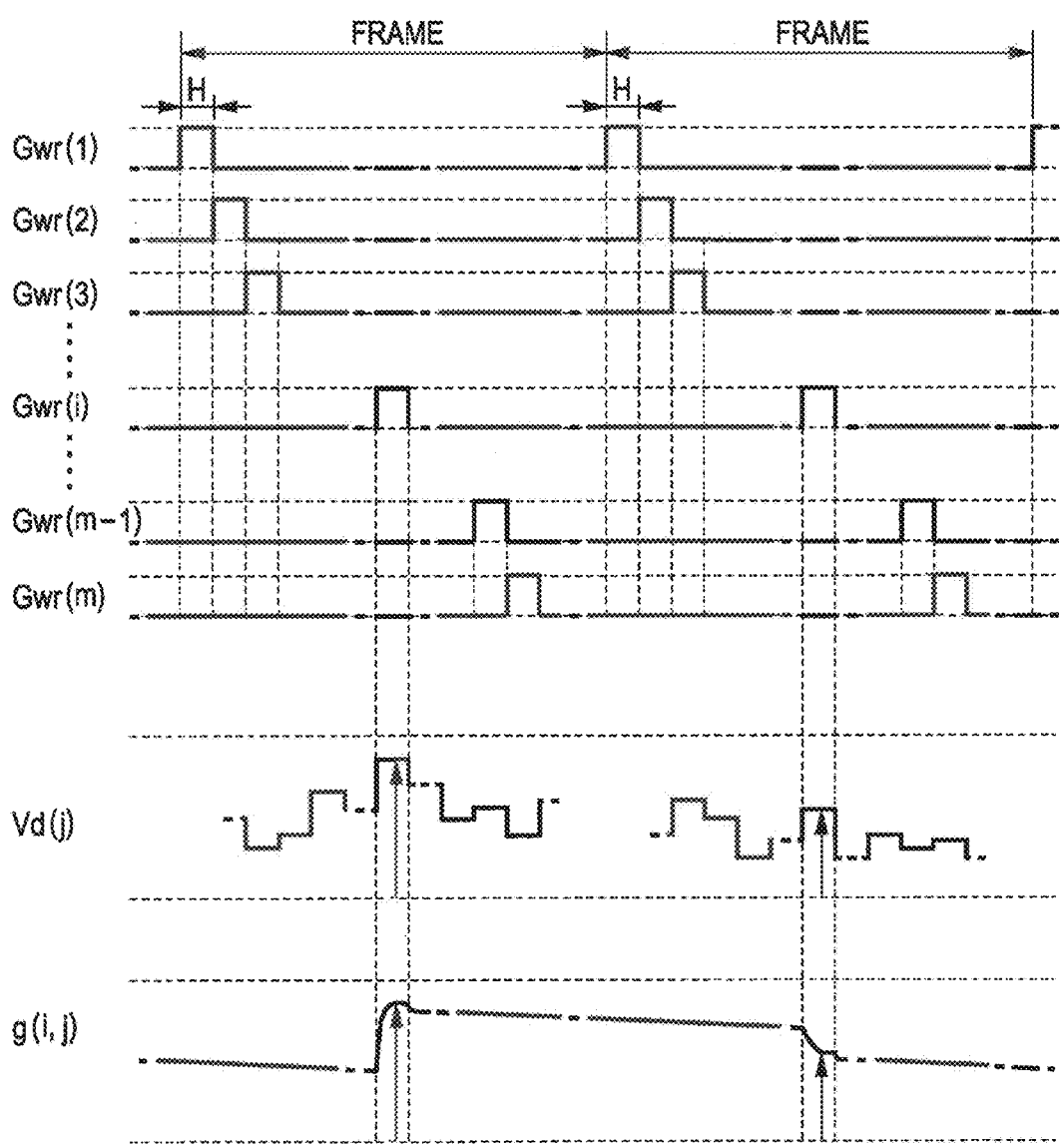
FIG. 3 is a diagram which shows a display operation of the electro-optical device.

Subsequently, a display operation of the electro-optical device 1 will be simply described with reference to FIG. 3. FIG. 3 is a diagram which shows an example of a waveform of the scanning signal and the data signal.

As shown in the drawing, the scanning signals Gwr (1), Gwr (2), Gwr(3), . . . , Gwr (m−1), and Gwr(m) are sequentially set to (H) level exclusively, for every horizontal scanning period (H) in each frame by the scanning line driving circuit 210.

Here, when the ith row scanning line 112 is selected, and the scanning signal Gwr (i) is set to (H) level, a data signal Vd (j) of a potential which corresponds to gray scale data of the pixel circuit 110 on the ith row and jth column is supplied by the data line driving circuit 220 in the date line 114 on the jth column.

When the scanning signal Gwr (i) is set to H level in the pixel circuit 110 on the ith row and jth column, since the transistor 130 is turned on, the gate node g (i, j) is electrically connected to the data line 114 on the jth column. For this reason, the potential of the gate node g (i, j) becomes the potential of data signal Vd (j) as denoted by an up arrow in FIG. 3. At this moment, the transistor 140 flows a current which corresponds to the current of the gate node g (i, j) to the light emitting element 150, and the holding capacity 135 holds a voltage between the gate and source in the transistor 140 at this moment. When the selection of the scanning line 112 on the ith row is ended, and the scanning signal Gwr (i) becomes L level, the transistor 130 is turned off.

Even if the transistor 130 is turned off from the on state, the voltage of the transistor 140 between the gate node and the source node when the transistor 130 is turned on is held by the holding capacity 135. For this reason, even if the transistor 130 is turned off, the transistor 140 continuously flows a current corresponding to the hold voltage by the holding capacity 135 to the light emitting element 150, until the next scanning line 112 on the ith row is selected again. For this reason, the light emitting element 150 in the pixel circuit 110 on the ith row and jth column continuously emits light during the period corresponding to one frame with a brightness corresponding to a potential of data signal Vd (j) at the time of selecting the ith row, that is, with a brightness corresponding to the gray scale data of the ith row and jth column.

In addition, in the ith row, the light emitting element emit lights with a brightness corresponding to a potential of a data signal which has been supplied to the corresponding data line 114, even in a pixel circuit 110 other than the jth column. Further, a pixel circuit 110 corresponding to the scanning line 112 on the ith row is described here, however, the scanning line 112 is selected in order of the first row, the second row, the third row, . . . , the (m−1)th row, and the mth row. As a result, each of the pixel circuits 110 emits light with a brightness corresponding to the gray scale data, respectively. Such an operation is repeated for every frame.

In addition, in FIG. 3, potential scales of the data signal Vd (j) and the gate node g (i, j) are conveniently enlarged, compared to a potential scale of the scanning signal.

Meanwhile, since the data signal has a potential corresponding to the gray scale data of a pixel which is positioned on the selected row, the data line 114 is subject to potential fluctuation every second according to the display content. For example, since the data signal Vd (j) as shown in FIG. 3 is supplied to the data line 114 on the jth column, the potential fluctuates for every horizontal scanning period (H).

When the data line 114 performs capacitative coupling with each part of the pixel circuit 110, the potential fluctuation of the data line 114 has a negative influence on the potential of each part of the pixel circuit 110. Particularly, when a smaller size and higher resolution of the display is required, and for example, in a micro display for which the display size is less than one inch in diagonal, and the resolution is 1280×720 pixels or more, the negative influence is prominent, since the parasitic capacitance of each part is relatively large compared to the holding capacity 135. Particularly, the potential of the gate node g and source node s of the transistor 140 define a current which flows to the light emitting element 150, the potential fluctuation of this part generates a garbled display or crosstalk which will be described later, and causes a serious degradation of a display quality.

Therefore, according to the embodiment, the pixel circuit 110 is configured as follows, and it is difficult to be influenced by noise due to the potential fluctuation of the data line.

The structure of the pixel circuit 110 will be described with reference to FIGS. 4 and 5.

Figure 4:
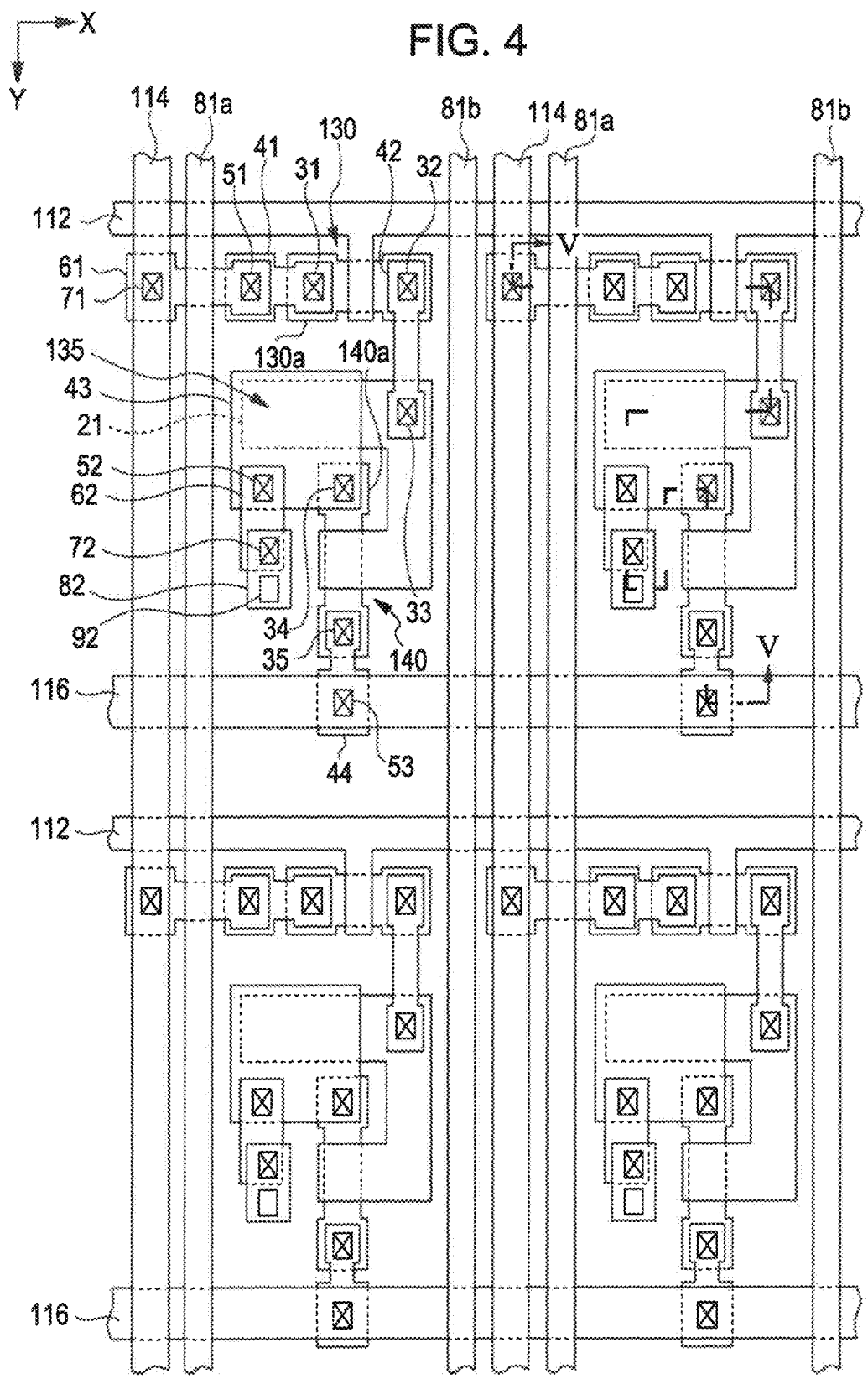
FIG. 4 is a plan view which shows a configuration of the pixel circuit.

FIG. 4 is a plan view which shows a configuration of four pixel circuits 110 which are close to each other in the vertical and horizontal directions. FIG. 5 is a partial cross-sectional view of the pixel circuit in FIG. 4 which is cut along line V-V.

In addition, FIG. 4 shows a wiring structure of the pixel circuits 110 of a top emission-type when seen in the plan view from the viewer side, however, for simplicity, a structure which is formed after the pixel electrode (anode) in the light emitting element 150 is omitted. In FIG. 5, structures up to the pixel electrode of the light emitting element 150 are shown, and the structures thereafter are not shown. In addition, hereinafter, in each drawing, reduced scales of each layer, each member, each region, or the like are differentiated in order to set to a recognizable size.

Figure 5:
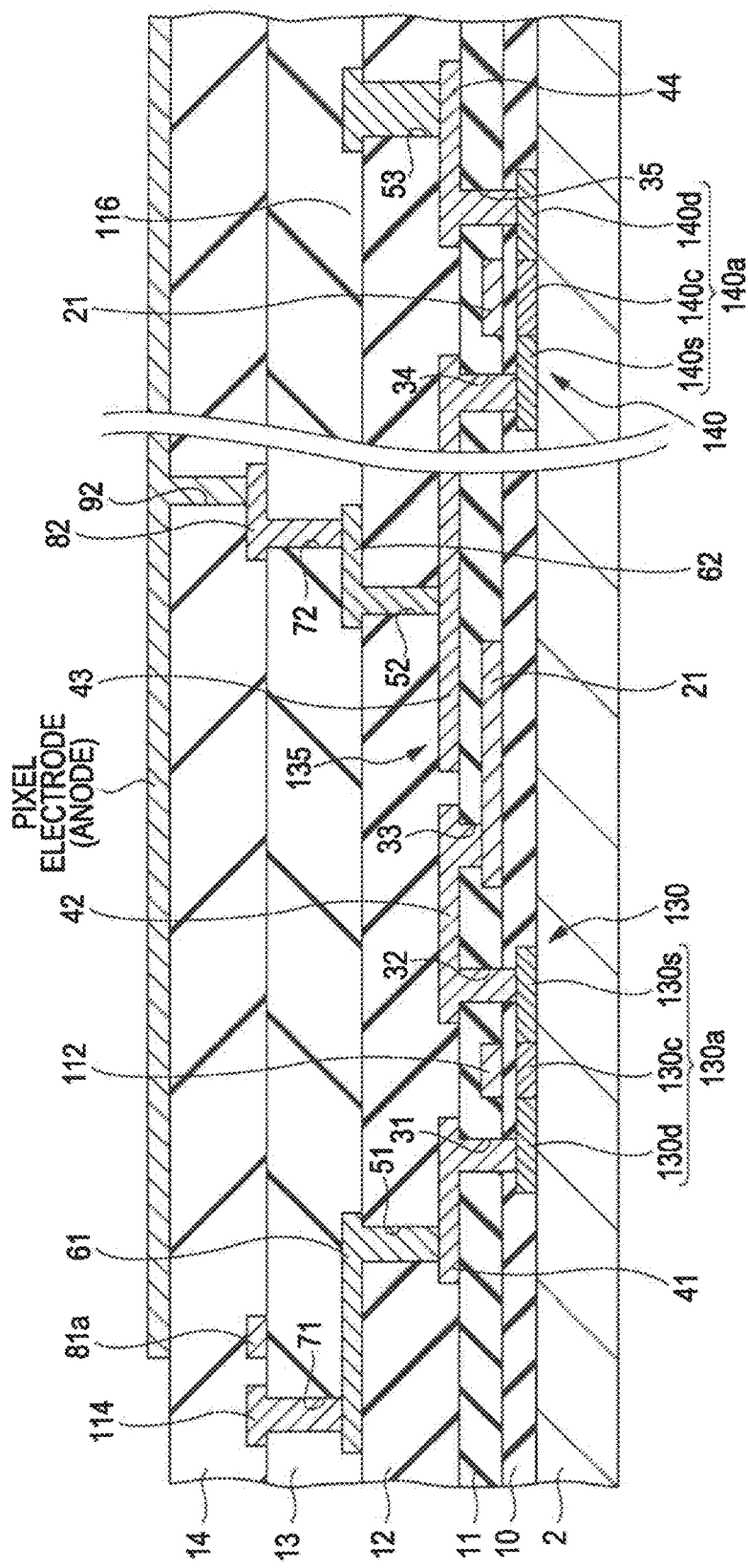
FIG. 5 is a partial cross-sectional view which shows the configuration in FIG. 4 which is cut along line V-V.

First, as shown in FIG. 5, a substrate 2 as a base is provided with respective semiconductor layers 130a and 140a on which a polysilicon film is patterned in a shape of an island. The semiconductor layer 130a forms the transistor 130, and the semiconductor layer 140a forms the transistor 140. Here, the semiconductor layer 130a is formed in a shape of a rectangle of which straight side horizontally extends along the scanning line 112 which will be formed later, as shown in FIG. 4 when seen in the plan view. On the other hand, the semiconductor layer 140a is formed in the shape of a rectangle of which straight side horizontally extends along the data line 114 which will be formed later, when seen in the plan view.

As shown in FIG. 5, a gate insulating layer 10 is provided so as to substantially cover the entire surface of the semiconductor layer 130a and the semiconductor layer 140a. A gate wiring layer of aluminum or tantalum is provided on the front surface of the gate insulating layer 10, and the respective scanning line 112 and gate electrode layer 21 are provided by patterning the gate wiring layer.

The scanning line 112 extends in the horizontal direction in FIG. 4, has a branched portion toward the downward direction for every pixel circuit 110, and the branched portion thereof is overlapped with the center portion of the semiconductor layer 130a. Among the semiconductor layers 130a, the region which overlaps with the branched portion of the scanning line 112 is the channel region 130c (refer to FIG. 5). In addition, in FIG. 5, in the semiconductor layers 130a, the left side is the drain region 130d, and the right side is the source region 130s with respect to the channel region 130c.

On the other hand, the gate electrode layer 21 has a shape of a rectangular frame in which the upper side, the right side, and the lower side are integrated without having a left side, as shown in FIG. 4 when seen in the plan view. Among these, the lower side is overlapped with the center portion of the semiconductor layer 140a. Among the semiconductor layers 140a, a region which is overlapped with the lower side of the gate electrode layer 21 becomes the channel region 140c (refer to FIG. 5). In the semiconductor layer 140a, in FIG. 5, the left side is the drain region 140d, and the right side is the source region 140s with respect to the channel region 140c.

In FIG. 5, a first interlayer insulating layer 11 is formed so as to cover the scanning line 112, the gate electrode layer 21 or the gate insulating layer 10. A conductive wiring layer is formed, and relay electrodes 41, 42, 43, and 44 are respectively formed on the front surface of the first interlayer insulating layer 11.

Among these, the relay electrode 41 is connected to the drain region 130d through a contact (via) hole 31 which respectively opens the first interlayer insulating layer 11 and the gate insulating layer 10.

In addition, in FIG. 4, a portion where an "x" mark is applied to the "□" mark is a contact hole.

In FIG. 5, one end of the relay electrode 42 is connected to the source region 130s through a contact hole 32 which respectively opens the first interlayer insulating layer 11 and the gate insulating layer 10. On the other hand, the other end of the relay electrode 42 is connected to the gate electrode layer 21 through a contact hole 33 which opens the first interlayer insulating layer 11.

The relay electrode 43 is connected to the source region 140s through a contact hole 34 which respectively opens the first interlayer insulating layer 11 and the gate insulating layer 10. Here, the shape of the relay electrode 43 when seen in the plan view is a rectangle so as to cover the upper side of the gate electrode layer 21 as shown in FIG. 4. For this reason, the holding capacity 135 has a configuration in which the first interlayer insulating layer 11 is interposed between the gate electrode layer 21 and the relay electrode 43 as shown in FIG. 5.

The relay electrode 44 is connected to the drain region 140d through a contact hole 35 which respectively opens the first interlayer insulating layer 11 and the gate electrode layer 21.

A second interlayer insulating layer 12 is formed so as to cover the relay electrodes 41, 42, 43, and 44 or the first interlayer insulating layer 11. A conductive wiring layer is formed on the front surface of the second interlayer insulating layer 12, and relay electrodes 61 and 62, and the power supply line 116 are respectively formed by patterning the wiring layer.

Among these, the relay electrode 61 is connected to the relay electrode 41 through a contact hole 51 which opens the second interlayer insulating layer 12. The relay electrode 62 is also connected to the relay electrode 43 through a contact hole 52 which opens the second interlayer insulating layer 12.

The power supply line 116 is connected to the relay electrode 44 through a contact hole 53 which opens the second interlayer insulating layer 12. For this reason, the power supply line 116 is connected to the drain region 140d through the relay electrode 44. The power supply line 116 is formed in the horizontal direction where the scanning line 112 extends as shown in FIG. 4 when seen in the plan view.

In addition, the relay electrodes 41 and 61, the relay electrodes 43 and 62, and the relay electrode 44 and the power supply line 116 may be connected to the contact holes 51, 52, and 53 respectively, by filling up a columnar connection plug which is formed of a high melting point metal such as tungsten.

A third interlayer insulating layer 13 is formed so as to cover the relay electrodes 61 and 62, and second interlayer insulating layer 12. A conductive wiring layer is formed on the front surface of the third interlayer insulating layer 13, and the data line 114, shield wires 81a and 81b (not shown in FIG. 5), and a relay electrode 82 are respectively formed by patterning the wiring layer.

Among these, the data line 114 is connected to the relay electrode 61 through a contact hole 71 which opens the third interlayer insulating layer 13. For this reason, the data line 114 is connected to a drain region 130d following paths of the relay electrodes 61 and 41. Here, the data line 114 is formed in the vertical direction which is orthogonal to the extension direction of the scanning line 112 as shown in FIG. 4 when seen in the plan view.

A relay electrode 82 is connected to the relay electrode 62 through a contact hole 72 which opens the third interlayer insulating layer 13.

In addition, the relay electrode 61 and the data line 114, and the relay electrodes 62 and 82 may be respectively connected to the contact holes 71 and 72, by filling up a columnar connection plug which is formed of a high melting point metal.

Each of the shield wires 81a and 81b is respectively formed corresponding to each column as shown in FIG. 4 when seen in the plan view.

In detail, a shield wire 81a on a certain column is formed in the horizontal direction on the right side of a data line 114 so as to be positioned between the data line 114 on the column and a transistor 140 in a pixel circuit 110 on the column. At this time, the shield wire 81a is provided to be close to the data line 114 when comparing between the data line 114 and the transistor 140. That is, the distance between the shield wire 81a and the data line 114 is set to be shorter than the distance between the shield wire 81a and the transistor 140. For this reason, the shield wire 81a easily perform the capacitative coupling with the data line 114 compared to the transistor 140.

On the other hand, a shield wire 81b on a certain column is formed in the vertical direction on the left side of a data line 114 so as to be positioned between a neighboring data line 114 on the right side with respect to the column and a transistor 140 in a pixel circuit 110 on the column. At this time, the shield wire 81b is provided to be close to the data line 114 when comparing between the data line 114 and the transistor 140. That is, the distance between the shield wire 81b and the data line 114 is shorter than the distance between the shield wire 81b and the transistor 140. For this reason, the shield wire 81b easily perform the capacitative coupling with the data line 114 compared to the transistor 140.

The shield wires 81a and 81b are disposed to be interposed between a data line 114 on the left side and a data line 114 on the right side, however, the shield wire 81a is disposed before the data line 114 on the left side and the shield wire 81b is disposed before the data line 114 on the right side, when seen from the transistor 140 in the plan view.

In addition, the shield wires 81a and 81b are formed in the vertical direction as shown in FIG. 4, and are extended to the outside of a region where the pixel circuit 110 is arranged, and are applied with a constant potential in time, for example, the potential Ve1 is applied thereto.

Further, the shield wires 81a and 81b may be connected through a contact hole in a portion which intersects with the power supply line 116 when seen in the plan view for every one row, or for a couple of rows.

A fourth interlayer insulating layer 14 is formed so as to cover the data line 114, the shield wires 81a and 81b, and a relay electrode 82, or the third interlayer insulating layer 13.

A wiring layer with conductivity and reflectivity is formed on the front surface of the fourth interlayer insulating layer 14, and an anode of the light emitting layer 150 is formed by patterning the wiring layer. The anode is an individual pixel electrode for each pixel circuit 110, and is connected to a relay electrode 82 through a contact hole 92 which opens the fourth interlayer insulating layer 14. For this reason, the anode (pixel electrode) is connected to the source region 140s following paths of the relay electrodes 82 and 62, and the relay electrode 43 which also functions as the other electrode of the holding capacity 135.

In addition, the relay electrode 82 and the pixel circuit may be connected to the contact hole 92, by filling up the connecting plug of the columnar shape which is formed of a high melting point metal.

Further structure of the electro-optical device 1 will not be shown, however, a light-emitting layer which is formed of an organic EL material is laminated to the anode for every pixel circuit 110, and a common transparent electrode is provided in each pixel circuit 110 as a common electrode 118 which functions as the cathode, as well. In this manner, the light emitting element 150 becomes an OLED which interposes the light-emitting layer with the anode and the cathode which face each other, emits light with a brightness corresponding to a current which flows from the anode toward the cathode, and is observed toward the direction opposite to the substrate 2 (top emission structure). In addition to this, sealing glass for cutting off the light-emitting layer from the air, or the like, is provided, however, the description thereof will be omitted.

In addition, in FIG. 4, since a pixel electrode as the anode of the light emitting element 150 is not shown in the drawing, the contact hole 92 only has the " ☐ " mark applied which denotes the position thereof.

Figure 6:
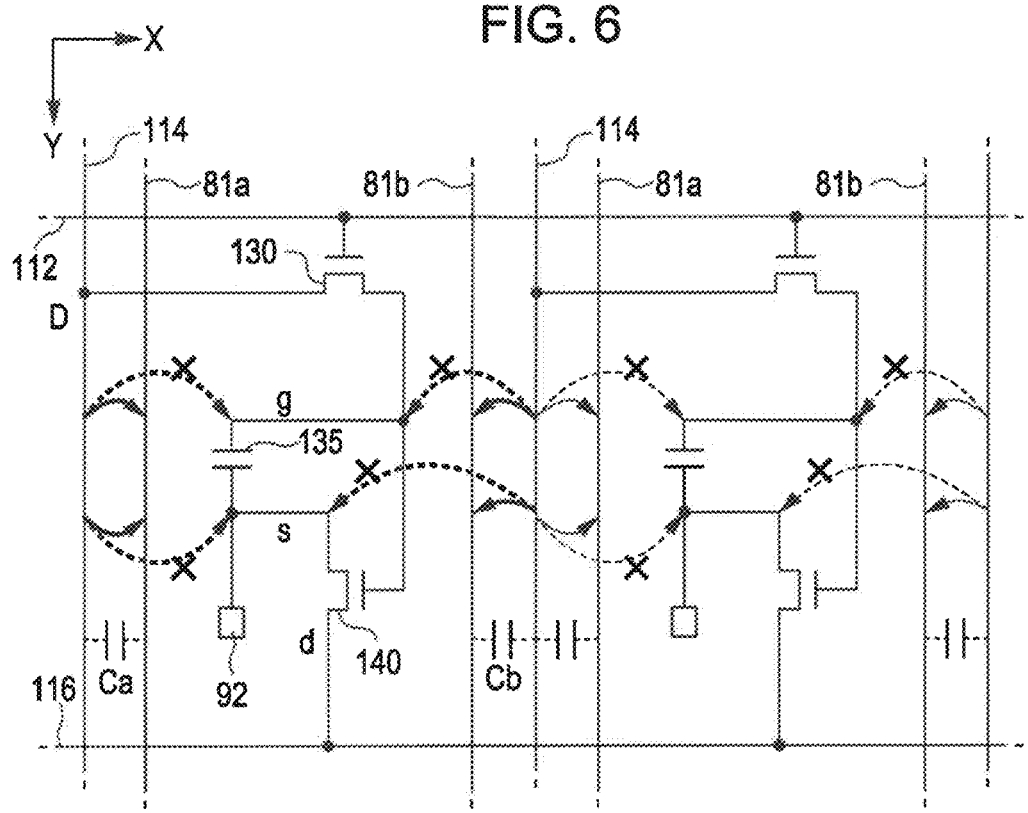
FIG. 6 is a diagram which shows absorption of noise from a data line in the pixel circuit.

Subsequently, a shielding function due to the shield wires 81a and 81b will be described with reference to FIG. 6. FIG. 6 is a diagram which shows the pixel circuit 110 shown in FIG. 4 for which the planar structure is replaced with an electrical circuit.

As described above, since the data line 114 of each column is subject to potential fluctuation, noise which is caused by the potential fluctuation propagates to each part of the pixel circuit 110.

According to the first embodiment, the shield wire 81a is positioned before the gate node g and the source node of the transistor 140 on the ith row and jth column when seen from the data line 114 on the jth column. For this reason, the noise generated from the data line 114 on the jth column is absorbed by the capacitative coupling Ca between the shield wire 81a and the data line 114 on the jth column.

In addition, the shield wire 81b is also positioned before the gate node g and the source node of the transistor 140 on the ith row and jth column when seen from the data line 114 on the (j+1)th column. For this reason, the noise which is generated from the data line 114 on the (j+1)th column is absorbed by the capacitative coupling Cb between the shield wire 81b and the data line 114 on the (j+1)th column.

Therefore, according to the electro-optical device 1, it is possible to perform a stable display, since the gate node g and the source node of the transistor 140 are not easily influenced by noise which is caused by the potential fluctuation of the data line 114.

In addition, according to the first embodiment, since the shield wires 81a and 81b are formed by patterning the same wiring layer as that of the data line 114 or the relay electrode 82, additional processes are not necessary in the manufacturing process.

Figure 7:
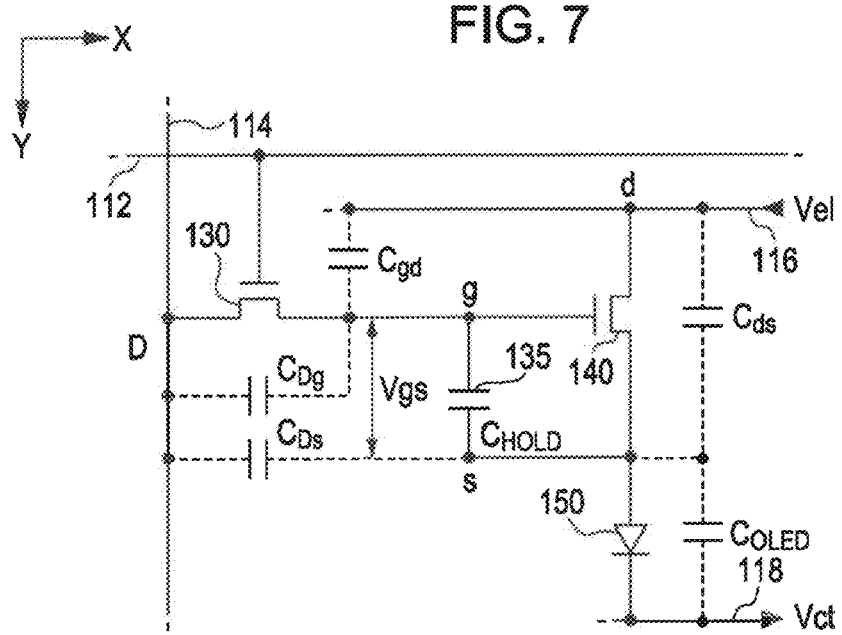
FIG. 7 is a diagram which shows a variety of parasitic capacitances in the pixel circuit.

FIG. 7 is a diagram which shows an equivalent circuit of the pixel circuit 110 along with the parasitic capacitance of each unit.

In the drawing, $C_{Dg}$ denotes the parasitic capacitance which is generated between the drain node D (data line 114) of the transistor 130 and the gate node g of the transistor 140, and $C_{Ds}$ denotes the parasitic capacitance which is generated between the drain node D of the transistor 130 and the source node of the transistor 140.

$C_{HOLD}$ denotes a capacity of the holding capacity 135.

$C_{gd}$ denotes the parasitic capacitance which is generated between the gate node g and the drain node d of the transistor 140 (power supply line 116), $C_{ds}$ denotes the parasitic capacitance which is generated between the drain node d and the source node of the transistor 140, and $C_{OLED}$ denotes capacitive components of the light emitting element 150.

In the pixel circuit 110, the transistor 130 is turned off when corresponding scanning line is in a non-selection period. In addition, the power supply line 116 and the common electrode 118 have a constant potential.

Figure 8:
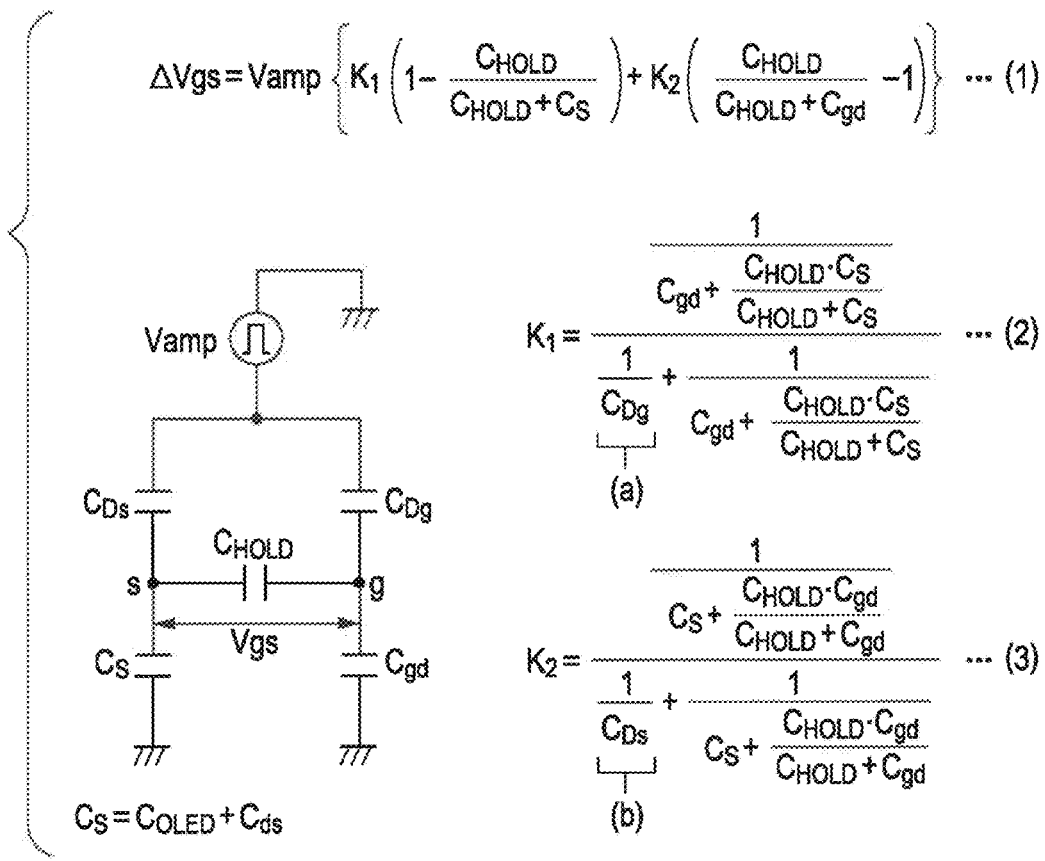
FIG. 8 is a diagram in which the variety of parasitic capacitances in the pixel circuit are modeled.

For this reason, the pixel circuit 110 in the non-selection period can be expressed as a simplified model as shown in FIG. 8. In addition, in the figure, Vamp is potential amplitude of the data line 114 in the non-selection period.

In this model, a fluctuation portion ΔVgs which is given to the holding voltage Vgs of the holding capacity 135 can be expressed as shown in the expression (1) in FIG. 8. In addition, a coefficient $K_1$ in the expression (1) is expressed as shown in the expression (2), and a coefficient $K_2$ is expressed as shown in the expression (3).

Since the embodiment include the shield wires 81a and 81b, the respective parasitic capacities $C_{Dg}$ and $C_{Ds}$ become small compared to a configuration which does not include the shield wires 81a and 81b.

For this reason, since the component of (a) in the expression (2), and all components of denominator become large, the coefficient $K_1$ becomes small. On the other hand, since the component of (b) in the expression (3), and all component of denominator become large, the coefficient $K_2$ becomes small.

Accordingly, in the embodiment, since the fluctuation portion ΔVgs with respect to the potential amplitude Vamp becomes small compared to the configuration which does not include the shield wires 81a and 81b, it is possible to perform a stable display which is not easily influenced by the potential fluctuation of the data line 114, the noise, or the like.

Here, when the potentials of the gate node g and the source node are fluctuated due to the noise which is caused by the potential fluctuation of the data line 114, in detail, when the fluctuation is actualized as a crosstalk as follows, the display quality is deteriorated.

Figure 9A:
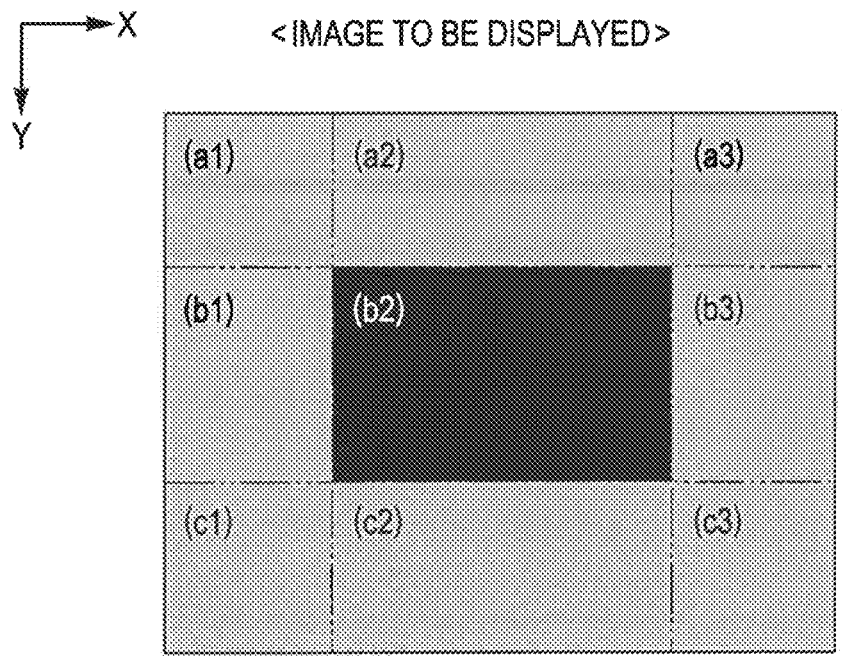
FIGS. 9A and 9B are diagrams which show an example of crosstalk.
Figure 9B:
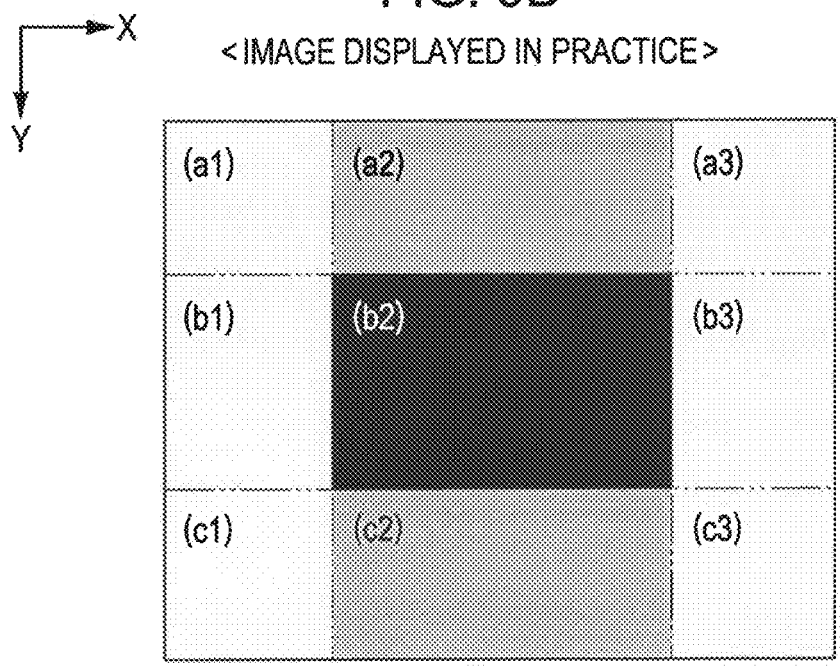

FIGS. 9A and 9B are diagrams which show an example of the crosstalk which is generated in an electro-optical device which does not include the shield wires 81a and 81b of the embodiment.

Here, as shown in FIG. 9A, crosstalk means a phenomenon in which, for example, when a black rectangular region is displayed on a window with a gray background region, in practice, as shown in FIG. 9B, the upper region (a2) and the lower region (c2) are displayed with different dark gray scale from the other gray regions (a1, a3, b1, b3, c1, and c3) with respect to the black region (b2).

In addition, in FIGS. 9A and 9B, brightness of the regions is expressed by a density of an oblique line. Further, crosstalk is also generated when the region (b2) is white. In both cases, since the region which is expressed with different gray scale appears in the up and down directions of the region (b2), it is sometimes especially referred to as vertical crosstalk.

It is considered that the vertical crosstalk is generated due to following reasons. That is, in a frame, a data line 114 which extends over the regions (a1, b1, and c1) has a constant potential corresponding to gray scale data over the selection from the first row to the last row m. For this reason, the pixel circuit 110 which belongs to the regions (a1, b1, and c1) holds the potential which is held in the gate node g due to a selection of a scanning line which corresponds to the own circuit, without being influenced by noise from the data line, respectively. The same is applied to a data line 114 which extends over regions (a3, b3, and c3), and a pixel circuit 110 which belongs to the regions (a3, b3, and c3). For this reason, each of pixel circuits 110 which belong to the regions (a1, a3, b1, b3, c1, and c3) emit light with a brightness which corresponds to the holing potential of the gate node g, in the entire region of a time period corresponding to one frame.

On the contrary, a data line 114 which extends over regions (a2, b2, and c2) has a potential which corresponds to gray gray scale data during selecting the region (a2), has a low potential which corresponds to black gray scale data during selecting the region (b2), and returns to the potential corresponding to the gray scale data during selecting the region (c2).

For this reason, in the pixel circuit 110 which belongs to the region (a2), even if the circuit holds a potential in which the gate node g corresponds to gray, due to a selection of a scanning line corresponding to the own circuit, the potential may change due to the noise which is caused by the potential fluctuation of the data line 114 when selecting the region (b2).

In addition, since the data line 114 returns to the potential corresponding to the gray when selecting the region (c2), the gate node g returns to the potential corresponding to the gray due to the returning of the data line 114. Alternatively, there is a possibility of approaching the potential.

However, for example, even if the gate node g returns to the potential corresponding to the gray, each of the pixel circuits 110 which belongs to the region (a2) emits light with a brightness corresponding to the potential which is lowered from the potential corresponding to the gray, during selecting at least the region (b2), in a period corresponding to one frame, after writing.

The same is applied to the region (c2). That is, in the pixel circuit 110 which belongs to the region (c2), even if the circuit holds the potential to which the gate node g corresponds to the gray due to a selection of a scanning line corresponding to the own circuit, the potential may change by being influenced by the potential fluctuation of the data line 114 when selecting the region (b2) in the next frame.

Accordingly, when considering the mean value of a period corresponding to one frame, each of the pixel circuits 110 which belongs to the regions (a2 and b2) is looked dark gray scale differently from each of the pixel circuits 110 which belongs to other regions (a1, a3, b1, b3, c1, and c3). It is considered that this is the mechanism in which the vertical crosstalk is generated.

According to the first embodiment of the invention, since each of the gate node g and the source node have a structure which is not easily influenced by noise which is caused by the potential fluctuation of the data line 114, due to the shield wires 81a and 81b, it is possible to suppress such a vertical crosstalk, and perform a display of high quality.

In addition, according to the first embodiment, the shield wires 81a and 81b were set to the same potential Vel as that of the power supply line 116, however, the shield wires may be held to another potential, for example, to the potential Vet.

Second Embodiment

According to the first embodiment, the shield wires 81a and 81b were formed, by patterning the same wiring layer as that of the data line 114, however, the shield wires may be formed of a wiring layer different from that of the data line 114. Therefore, subsequently, as a second embodiment, an example will be described, in which the shield wires 81a and 81b are formed of the same wiring layer as that of the relay electrodes 61 and 62 which are on the lower side of the data line 114, and the power supply line 116.

Figure 10:
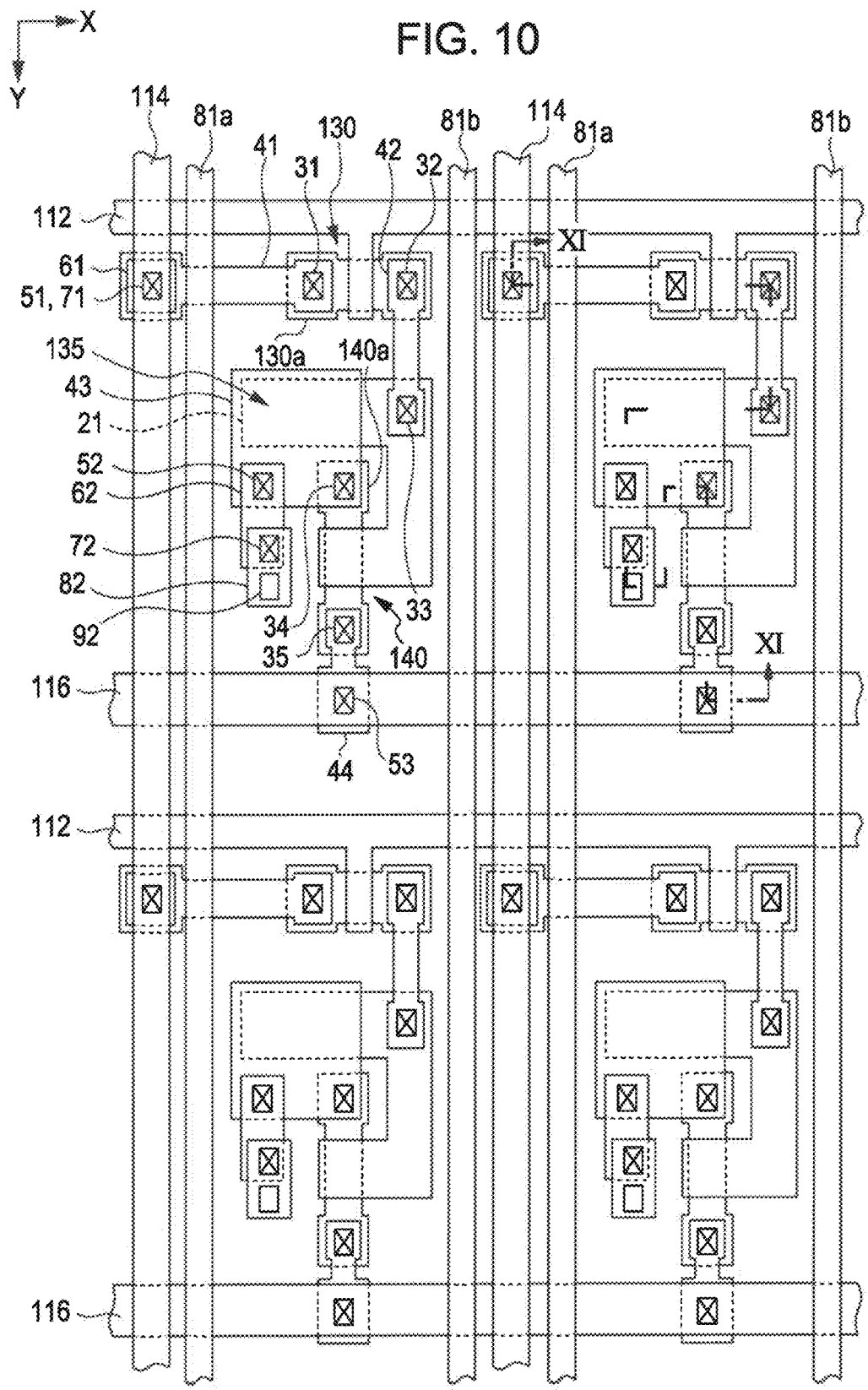
FIG. 10 is a plan view which shows a configuration of a pixel circuit of an electro-optical device according to a second embodiment of the invention.
Figure 11:
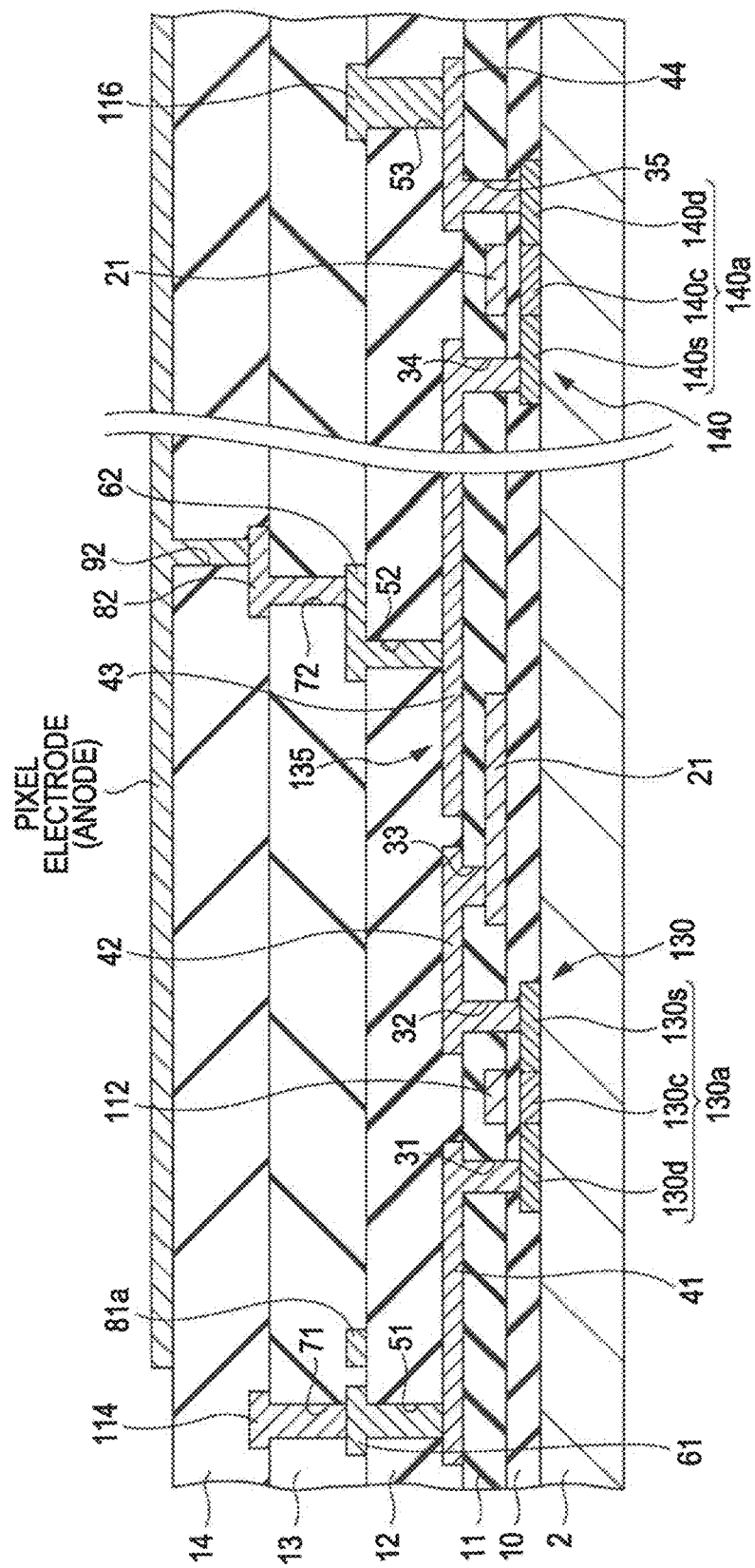
FIG. 11 is a partial cross-sectional view which shows the configuration in FIG. 10 which is cut along line XI-XI.

FIG. 10 is a plan view which shows a configuration of a pixel circuit 110 of an electro-optical device in the second embodiment. FIG. 11 is a partial cross-sectional view of the pixel circuit shown in FIG. 10 which is cut along line XI-XI.

When forming shield wires 81a and 81b from the same wiring layer as that of relay electrodes 61 and 62, and a power supply line 116, it is necessary to avoid interference (electrical contact) from the shield wire 81a and the relay electrode 61. In detail, it is necessary to provide a contact hole 51 to the outside (to the left side in FIGS. 10 and 11) of the shield wires 81a when seen in the plan view.

For this reason, in the second embodiment, as shown in FIG. 10, the contact holes 51 and 71 are arranged so as to be overlapped with each other at the same location when seen in the plan view, and a relay electrode 41 is extended to the same location. It is needless to say that the contact holes 51 and 71 may be arranged at a different location when seen in the plan view, for example, by extending a relay electrode 61 to a different location, or the like (now shown in the drawing).

Even in the second embodiment, since the shield wire 81a is positioned before each node of a transistor 140 on the ith row and jth column in the plan view, when seen from a data line 114 on the jth column, noise which is generated from the data line 114 on the jth column is absorbed by a capacitative coupling between the shield wire 81a and the data line 114 on the jth column.

In addition, the shield wire 81b is also positioned before each node of the transistor 140 on the ith row and jth column in the plan view, when seen from the data line 114 on a (j+1)th column, noise which is generated from the data line 114 on the (j+1)th column is absorbed by a capacitative coupling between the shield wire 81b and the data line 114 on the (j+1)th column.

For this reason, also in the second embodiment, it is possible to perform a stable display, since it is not easily influenced by noise or the like.

In addition, in the second embodiment, the shield wires 81a and 81b are formed by patterning the same wiring layer as that of the relay electrodes 61 and 62, and the power supply line 116, it is not necessary to provide additional processes in the manufacturing process, similarly to the first embodiment.

Further, in the second embodiment, the shield wires 81a and 81b are formed using a wiring layer which is different from that of the data line 114. For this reason, since the shield wires 81a and 81b do not come into contact with the data line 114, it is possible to make the pitch of the pixel circuit narrow. That is, according to the first embodiment, since the shield wires 81a and 81b are formed of the same wiring layer as that of the data line 114, it is necessary to separate the shield wires 81a and 81b from the data line 114, in order to secure the shielding function. On the contrary, since it is not necessary in the second embodiment, even if the shield wires 81a and 81b are overlapped with the data line 114 when seen in the plan view, since electrical insulating is secured if the shield wires and the data line are separated at a portion of the relay electrode 61, it is possible to make the pitch narrow easily.

Meanwhile, if the shield wire is formed to intersect with each node in the transistor 140 when seen in the plan view, more powerful shielding function is expected. Therefore, an example in which the shield wire is formed of the same wiring layer as that of the data line, and the shielding function is strengthened will be described as a third embodiment and a fifth embodiment. In addition, an example in which the shield wire is formed of a wiring layer different from that of data line, and the shielding function is strengthened will be described later as a sixth embodiment and a seventh embodiment.

Third Embodiment

Figure 12:
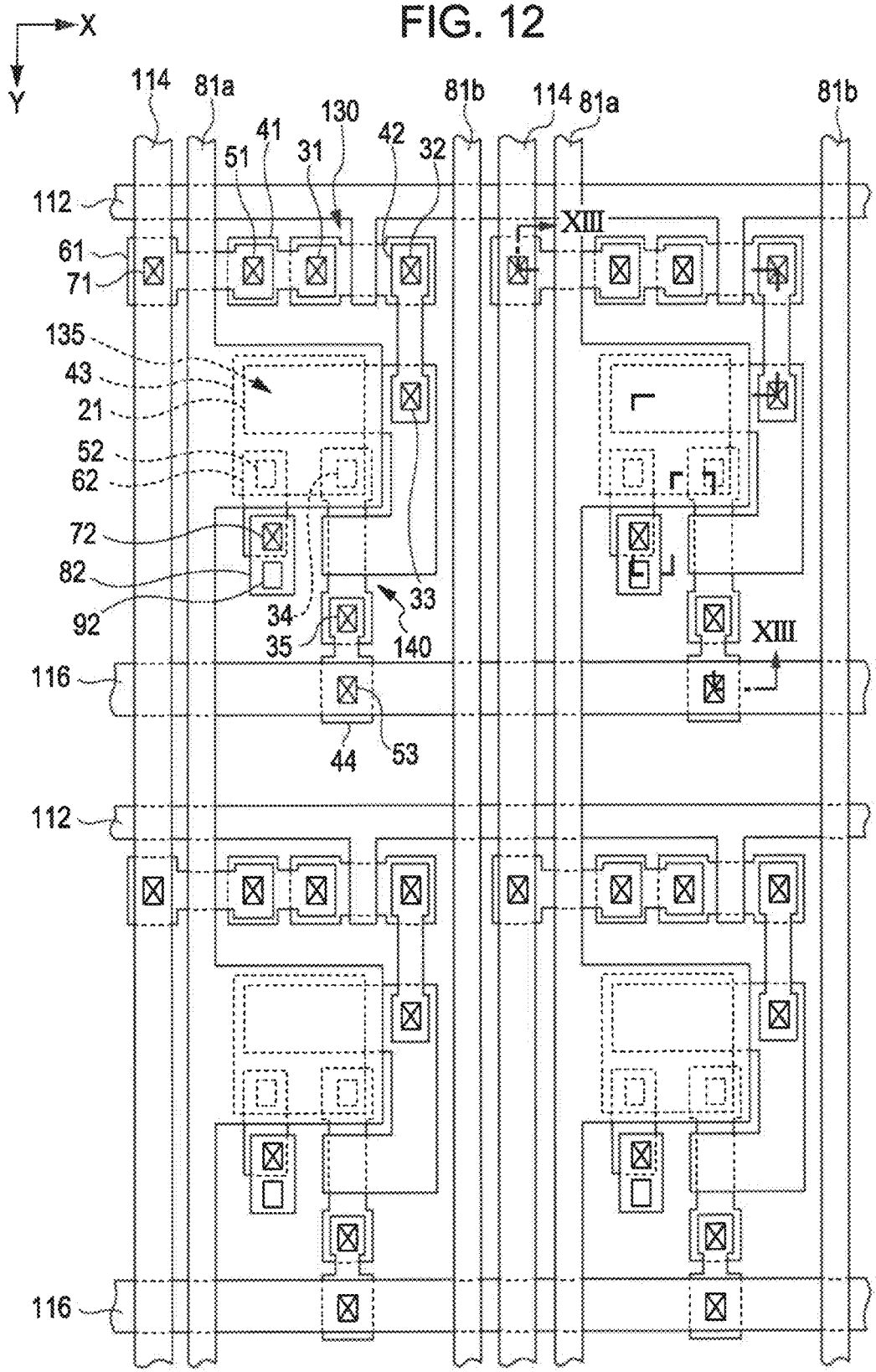
FIG. 12 is a plan view which shows a configuration of a pixel circuit of an electro-optical device according to a third embodiment of the invention.
Figure 13:
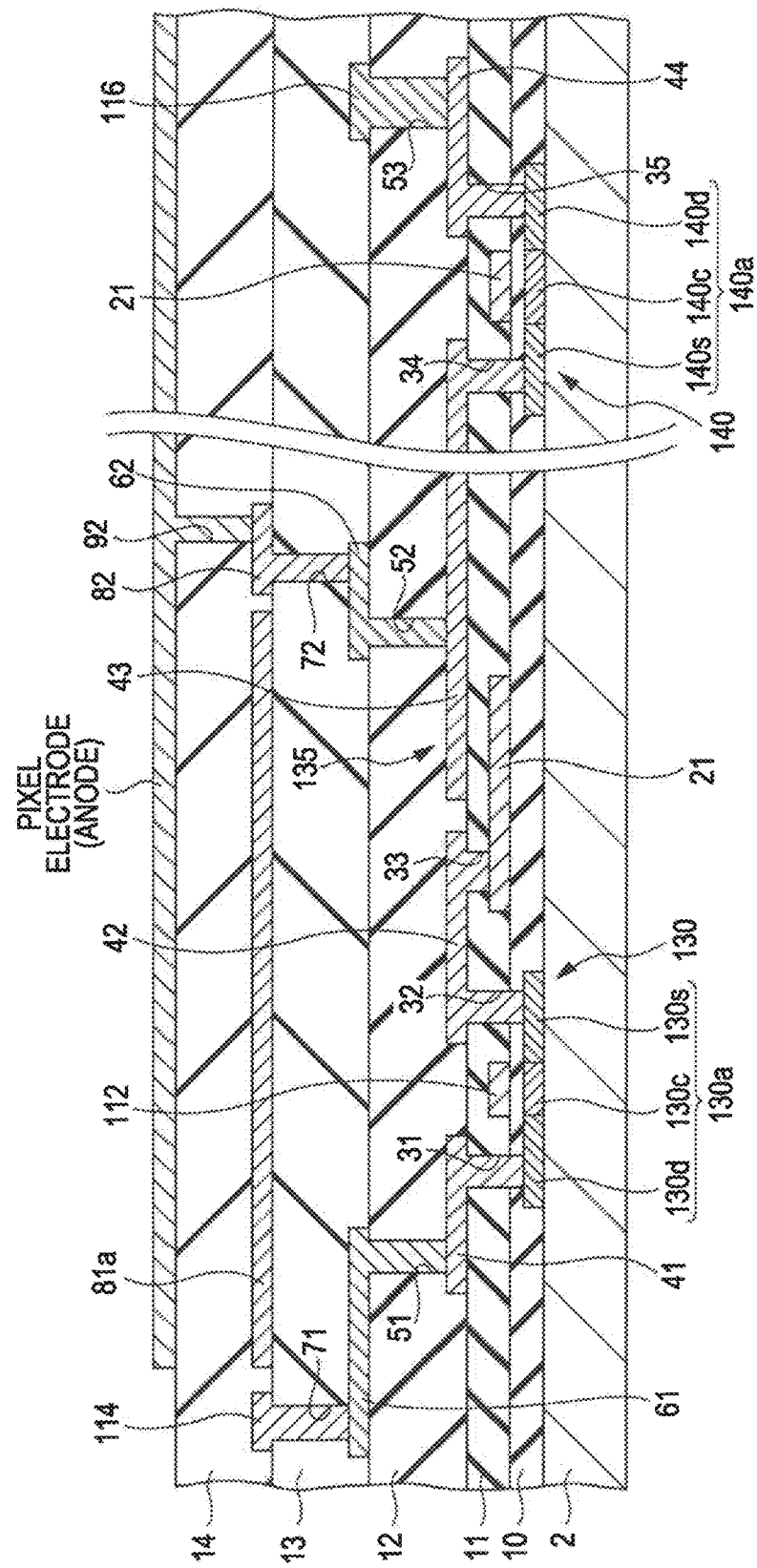
FIG. 13 is a partial cross-sectional view which shows the configuration in FIG. 12 which is cut along line XIII-XIII.

FIG. 12 is a plan view which shows a configuration of a pixel circuit 110 of an electro-optical device according to a third embodiment. FIG. 13 is a partial cross-sectional view of the pixel circuit in FIG. 12 which is cut along line XIII-XIII.

As shown in FIG. 12, in the third embodiment, a part of a shield wire 81a is extended toward the right side, and is formed to cover a relay electrode 43 when seen in the plan view. A holding capacity 135 is a region where the relay electrode 43 and a gate electrode layer 21 are overlapped with each other when seen in the plan view. The relay electrode 43 is the other electrode in the holding capacity 135, and also is a source node of the transistor 140. For this reason, in the third embodiment, the shielding function is further strengthened compared to the first embodiment.

Fourth Embodiment

Figure 14:
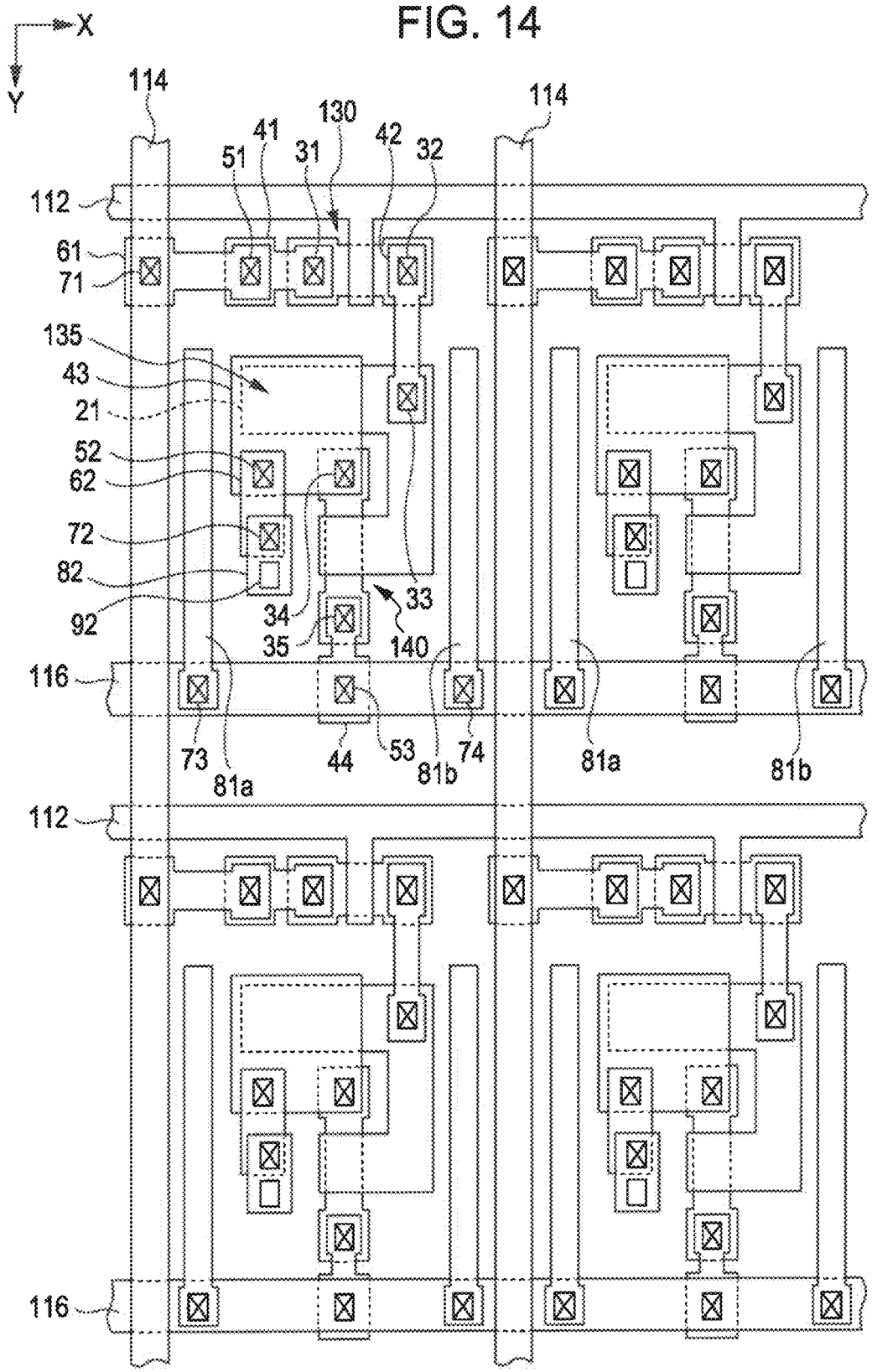
FIG. 14 is a plan view which shows a configuration of a pixel circuit of an electro-optical device according to a fourth embodiment of the invention.

FIG. 14 is a plan view which shows a configuration of a pixel circuit 110 of an electro-optical device according to a fourth embodiment.

As shown in FIG. 14, shield wires 81a and 81b are respectively formed in a strip shape along a data line 114 for every pixel circuit 110, and are respectively connected to a power supply line 116. In addition, in the fourth embodiment, the shield wires 81a and 81b are formed of the same wiring layer as that of the data line 114. For this reason, the shield wire 81a is connected to the power supply line 116 through a contact hole 73 which opens the third interlayer insulating layer 13. Similarly, the shield wire 81b is connected to the power supply line 116 through a contact hole 74 which opens the third interlayer insulating layer 13. In addition, a cross-sectional view thereof will be omitted.

If the shield wires 81a and 81b are formed to be one line along the data line 114, respectively, similarly to the first embodiment, there may be a case where it is not possible to sufficiently absorb the noise, since the impedances of the shield wires 81a and 81b become relatively high, when resistivity thereof is relatively high, or when the shield wires are separated from a connection point of the constant potential. On the contrary, according to the fourth embodiment, since the shield wires 81a and 81b are provided for every pixel circuit 110, and are connected to the power supply line 116, it is possible to obtain low impedance, and to increase the noise absorbing ability.

Fifth Embodiment

Figure 15:
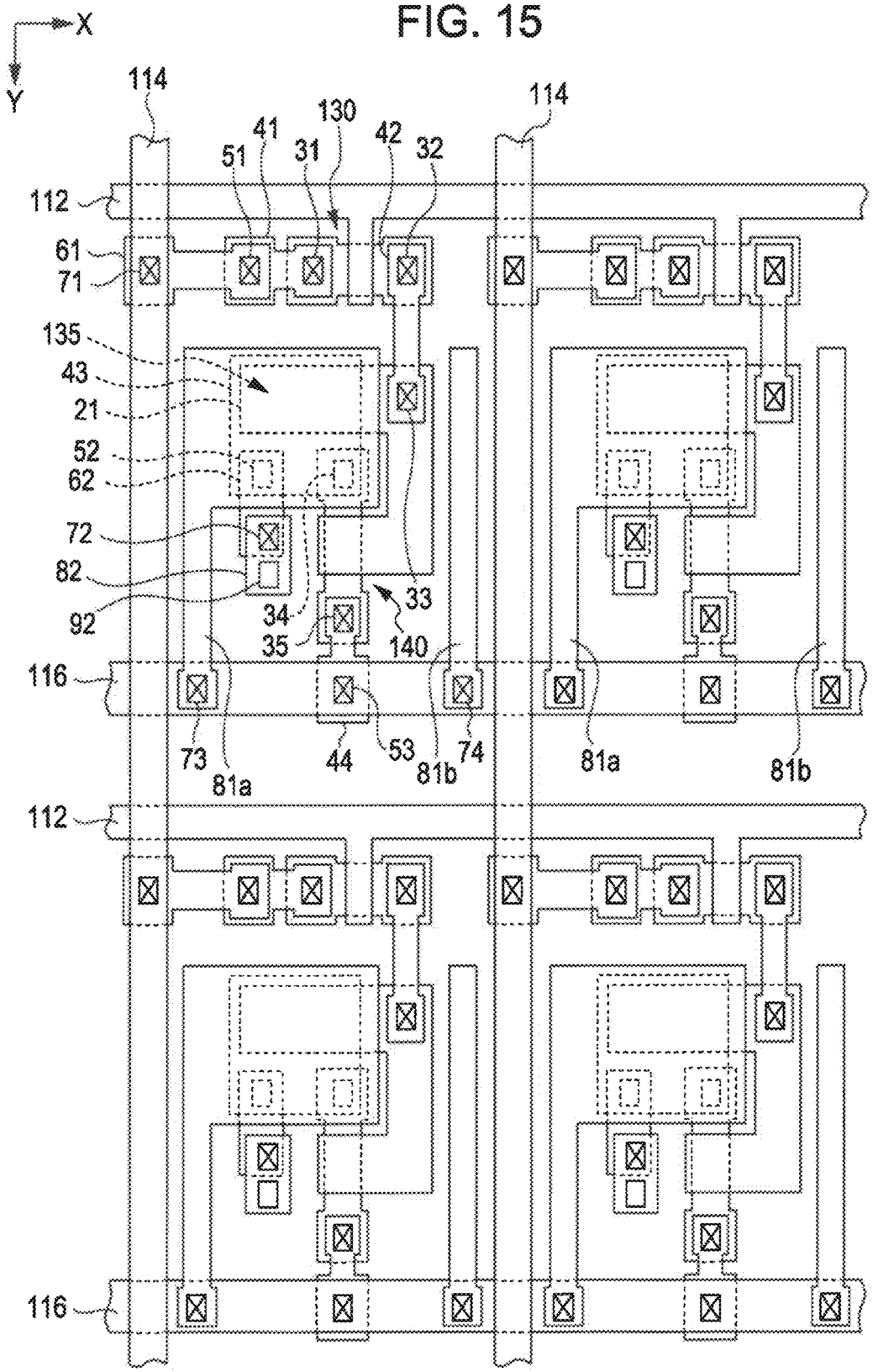
FIG. 15 is a plan view which shows a configuration of a pixel circuit of an electro-optical device according to a fifth embodiment of the invention.

FIG. 15 is a plan view which shows a configuration of a pixel circuit 110 of an electro-optical device according to a fifth embodiment. The fifth embodiment is a combination of the third embodiment and the fourth embodiment, and is formed to cover a relay electrode 43 when seen in the plan view, by changing the shape of the shield wire 81a shown in FIG. 14.

For this reason, according to the fifth embodiment, it is possible to raise the noise absorbing ability, by strengthening a shielding function.

Sixth Embodiment

Similarly to the second embodiment, when a shield wire is formed of a wiring layer which is different from that of a data line 114, it is preferable that the shield wire be provided at the lower side of the data line 114 so as to be overlapped with the data line 114 when seen in the plan view, not at both sides of the data line 114.

On the other hand, it was already mentioned in the fourth embodiment (fifth embodiment) that it is possible to raise the noise absorbing ability, when the shield wire is connected, for example, to a power supply line 116 for every pixel circuit 110.

Accordingly, subsequently, a sixth embodiment, as a combination of both, will be described in which a shield wire is formed of a wiring layer which is different from that of a data line 114, is provided at the lower side of the data line 114 so as to be overlapped with the data line 114 when seen in the plan view, and is integrated with the power supply line 116.

Figure 16:
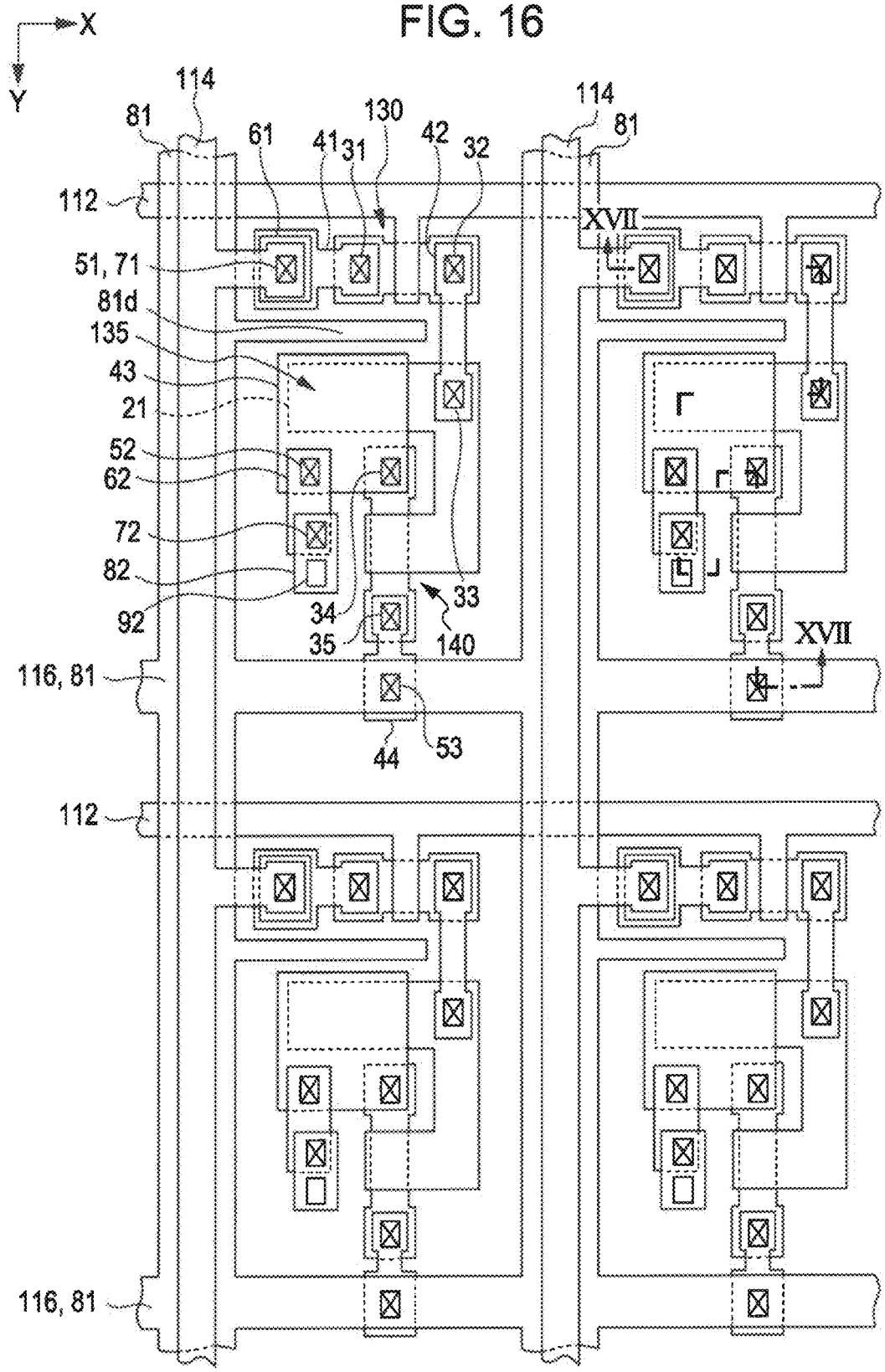
FIG. 16 is a plan view which shows a configuration of a pixel circuit of an electro-optical device according to a sixth embodiment of the invention.
Figure 17:
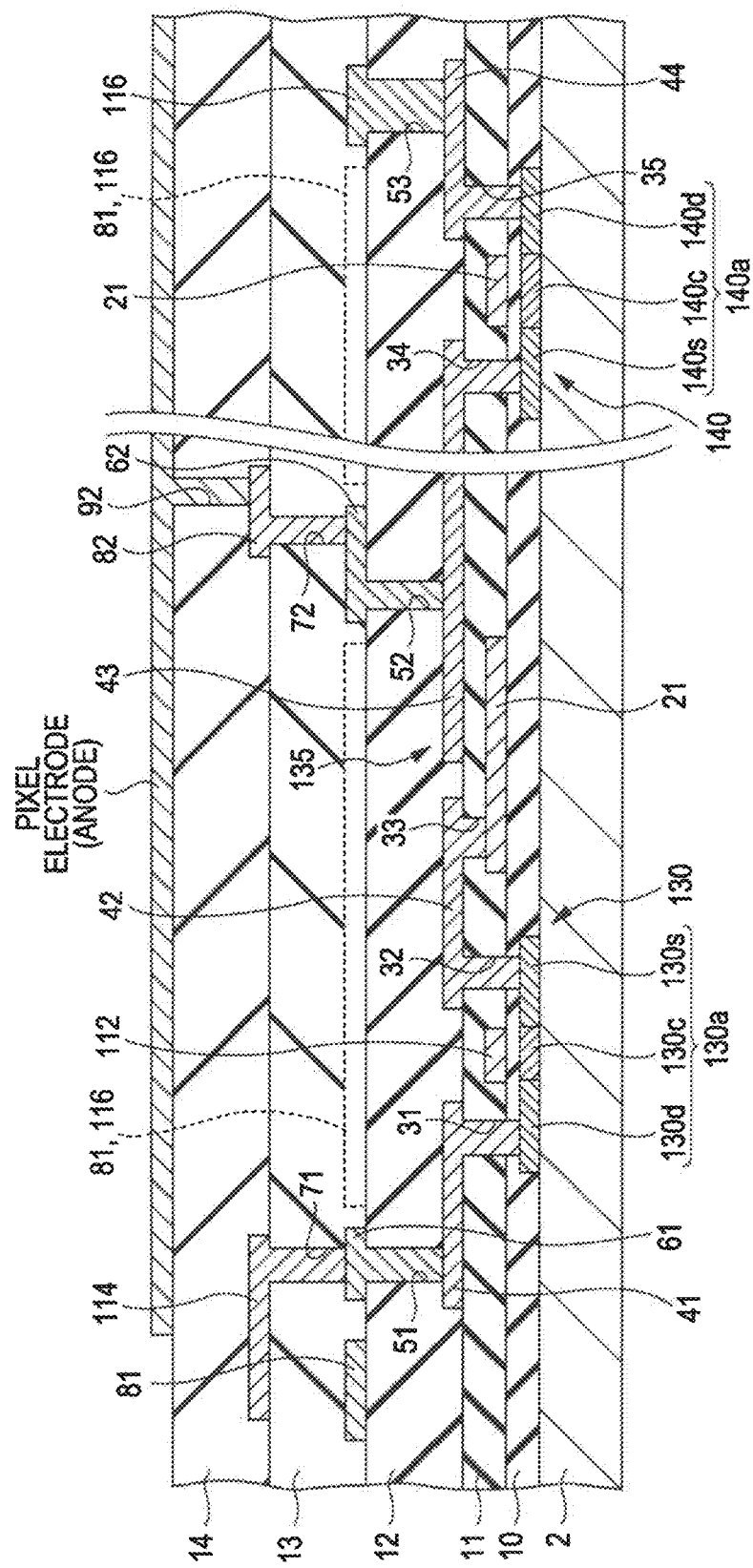
FIG. 17 is a partial cross-sectional view which shows the configuration in FIG. 16 which is cut along line XVII-XVII.

FIG. 16 is a plan view which shows a configuration of a pixel circuit 110 of an electro-optical device according to the sixth embodiment, and FIG. 17 is a partial cross-sectional view of the pixel circuit in FIG. 16 which is cut along line XVI-XVI.

The shield wires 81a and 81b are provided per column in the first embodiment to fifth embodiment, however, in the sixth embodiment, the shield wires 81a and 81b are integrated into one shield wire 81, and also functions as the power supply line 116.

As shown in FIG. 17, the shield wire 81 which also functions as the power supply line 116 is one in which a wiring layer formed in the second interlayer insulating layer 12 is patterned, along with the relay electrodes 61 and 62. As shown in FIG. 16, the shape of the shield wire 81 when seen in the plan view is that it has a wider width than the data line 114 so as to overlap with the vertical data line 114, and has a lattice shape by being integrated with the horizontal power supply line 116.

The data line 114 is connected to the drain region 130d through the relay electrodes 61 and 41 in order, however, since the shield wire 81 is formed of the same wiring layer as that of the relay electrode 61, it is not necessary to avoid the interference. For this reason, the data line 114 is branched to the right in FIG. 16, and is extended to a portion where the shield wire 81 is not formed. The contact hole 51 is formed at the extended portion, and connects the data line 114 to the relay electrode 61. In this manner, it is possible to electrically separate the shield wire 81 and the relay electrode 61 from each other without being interfered.

In addition, in this example, the contact holes 51 and 71 are arranged to be overlapped with each other at the same location when seen in the plan view. However, the contact holes 51 and 71 may be arranged at different location (not shown in the figure).

Meanwhile, in the sixth embodiment, since the data line 114 is branched and extended to the right, there is a possibility that the noise may jump into the gate node g and the source node of the transistor 140 from the extended portion. For this reason, in the sixth embodiment, a branch wire 81d, which is the shield wire 81 extended to the right, is provided between a branch portion of the data line 114 and the relay electrode 43 and gate electrode 21, when seen in the plan view. In this manner, a portion which is extended to the right side of the data line 114, that is, noise from the vicinity of the contact hole 71 is absorbed by the branch wire 81d, before reaching each node of the transistor 140.

According to the sixth embodiment, since the shield wire 81 is provided so as to be overlapped with the data line 114 when seen in the plan view, and of which potential is fixed by functioning as the power supply line 116 as well, it is possible to strengthen the shielding function.

Seventh Embodiment

Figure 18:
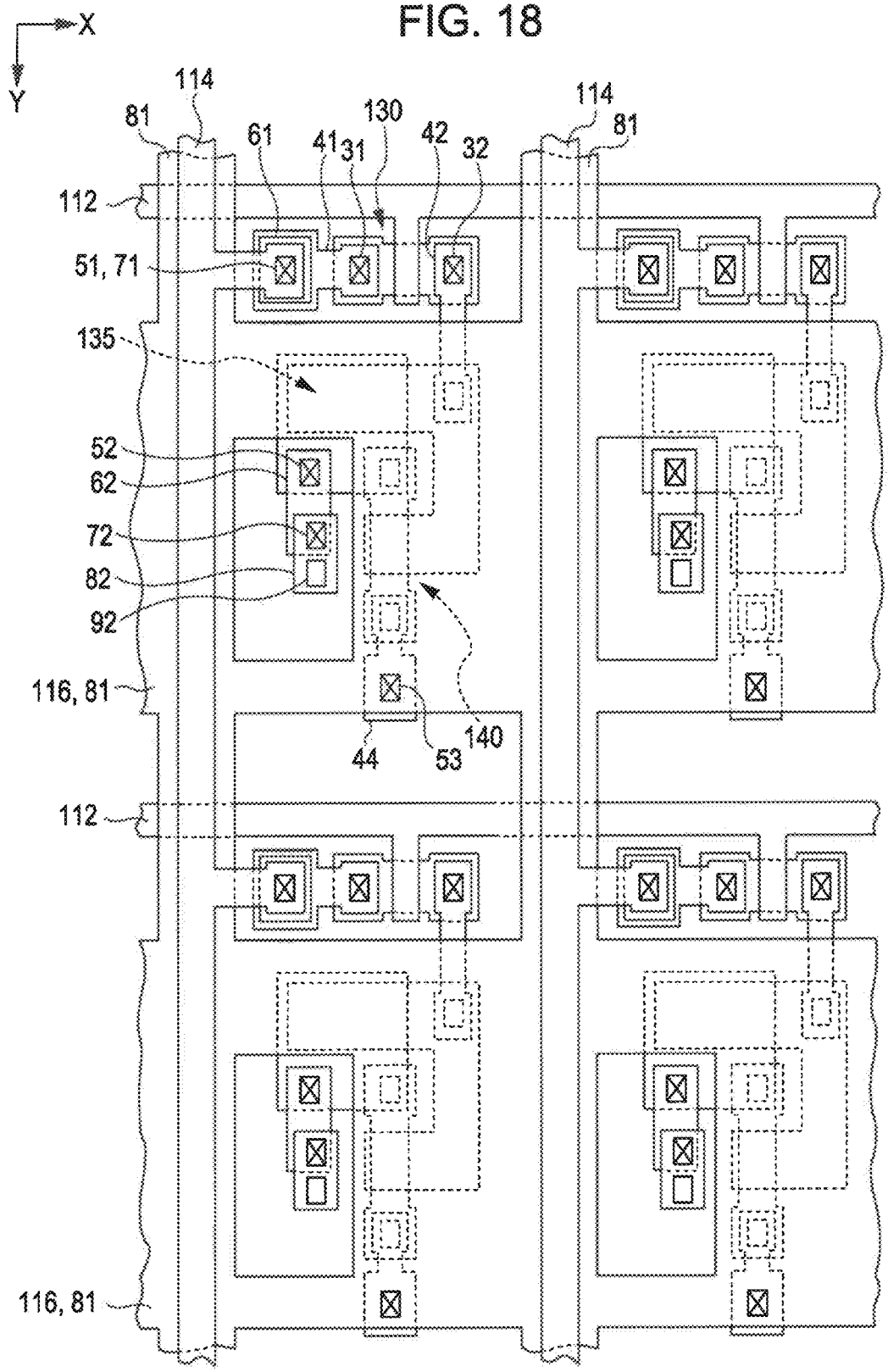
FIG. 18 is a plan view which shows a configuration of a pixel circuit of an electro-optical device according to a seventh embodiment of the invention.

FIG. 18 is a plan view which shows a configuration of a pixel circuit 110 of an electro-optical device according to a seventh embodiment.

As shown in the figure, in the seventh embodiment, the shield wire 81 which also functions as the power supply line 116 is to cover the holding capacity 135 (gate electrode layer 21) and the transistor 140 when seen in the plan view.

As described above, the shield wire 81 (power supply line 116) is formed by patterning the same wiring layer as that of the relay electrodes 61 and 62, it is necessary to avoid the interference with the relay electrodes 61 and 62. In the seventh embodiment, the shield wire 81 which also functions as the power supply line 116 has an open shape in the vicinity region of the relay electrodes 61 and 62.

In addition, the cross-sectional view of the main part of the pixel circuit 110 in the seventh embodiment will be a view to which the portion which is denoted by the broken line in FIG. 17 is added.

According to the seventh embodiment, the shield wire 81 is provided to be overlapped with the data line 114 when seen in the plan view, and to cover the holding capacity 135 and the transistor 140. In addition, since the potential thereof is fixed because it functions as the power supply line 116 as well, the shielding function thereof is further strengthened.

In addition, in the seventh embodiment, the open area of the shield wire 81 may be further narrowed as long as it is not interfering with the relay electrodes 61 and 62. Further, in the seventh embodiment, the shield wire 81 is supposed to cover the entire region of the holding capacity 135 and the transistor 140 when seen in the plan view, however, it may cover only a part thereof.

Application/Modified Example

The invention is not limited to the above described embodiments, and can be applied and modified.

For example, in a configuration of the holding capacity 135, the first interlayer insulating layer 11 was interposed between the gate electrode 21 and the relay electrode 43, however, for example, the gate insulating layer 10 may be interposed between a semiconductor layer and the gate electrode 21, by providing the semiconductor layer to be overlapped with the gate electrode layer 21, when seen in the plan view. As the semiconductor layer, a layer in which the source region 140s is extended may be used, or a layer which is separately patterned may be used. In addition to these, a configuration in which an interlayer insulating layer or a gate insulating layer is interposed between an electrode and wiring which are formed of different wiring layer may be adopted. In addition, a plurality of layers which is connected in parallel may be used as the overall holding capacity 135.

Figure 19:
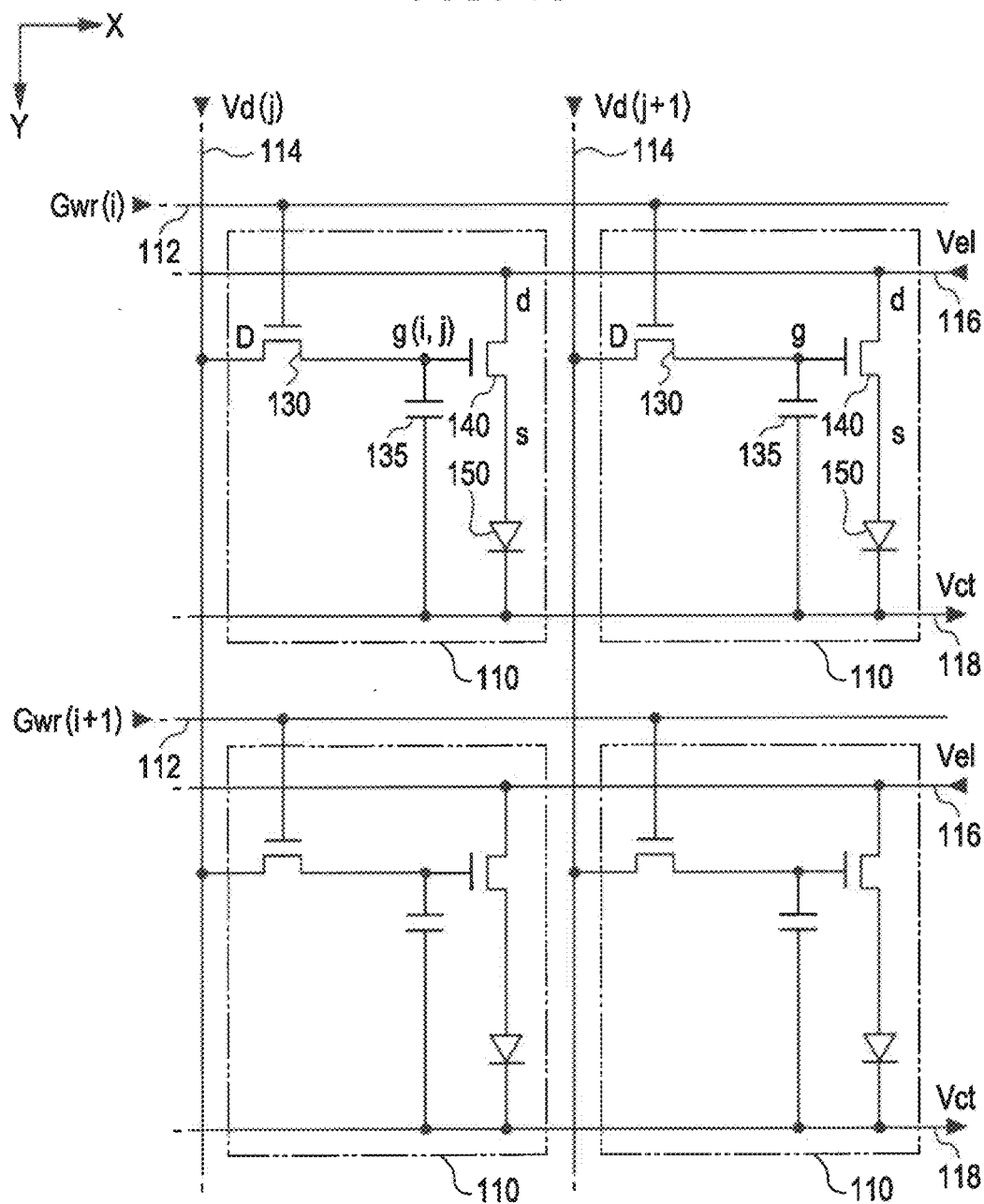
FIG. 19 is a diagram which shows an equivalent circuit of a pixel circuit according to a different example.

In addition, a position to which the holding capacity 135 is electrically inserted may be a location, for example, between the gate node g and the common electrode 118 as shown in FIG. 19, in addition to a location between gate node g and the source node of the transistor 140. It may be a location between the gate node g and a wiring which is fixed to other potential, even though it is not particularly shown in the figure.

The driving of the pixel circuit 110 is not limited to a method in which a data signal of a potential which simply corresponds to gray gray scale data is held in the gate node g, in a selection period where the transistor 130 is on state. For example, the driving of the pixel circuit may be performed such that the data line 114 is set to a reference potential in the selection period in which the transistor 130 is turned on, a power source due to the power supply line 116 and the common electrode 118 is switched between a first potential and a second potential, a voltage corresponding to a threshold voltage of the transistor 140 is held in the holding capacity 135, and after that the data line 114 becomes a potential which corresponds to the gray gray scale data. In addition, the driving of the pixel circuit may be performed such that the potential of the data signal is changed in the selection period, and time rate of change of the data signal at the end of selection period is set to a value which corresponds to the gray gray scale data. Further, the driving of the pixel circuit may be performed such that a lamp signal is provided to the source node through a capacitive element for every row, and causes a set current to flow to the transistor 140.

In any driving, it is possible to suppress the fluctuation of the potential of each node of the transistor 140 which flows a current to the light emitting element 150, by providing a shield wire of each embodiment in the pixel circuit 110 due to the noise from the data line 114.

In the shield wire, it is preferable to adopt a wiring layer in which two or more different wiring layers are patterned. For example, in the sixth (seventh) embodiment, it is preferable to have a double structure of the shield wire 81 (power supply line 116) and a separately formed shield wire, by patterning the data line 114 and the same wiring layer as that of the relay electrode 82. In addition, in the separate shield wire, it is preferable to avoid the interference with the data line 114 and the relay electrode 82.

As the light emitting element 150, an element which emits light with a brightness corresponding to a current, such as an inorganic EL element, an LED (Light Emitting Diode), or the like may be adopted, in addition to the OLED.

Electronic Apparatus

Subsequently, an electronic apparatus to which an electro-optical device according to the embodiment of the invention is applied will be described.

Figure 20:
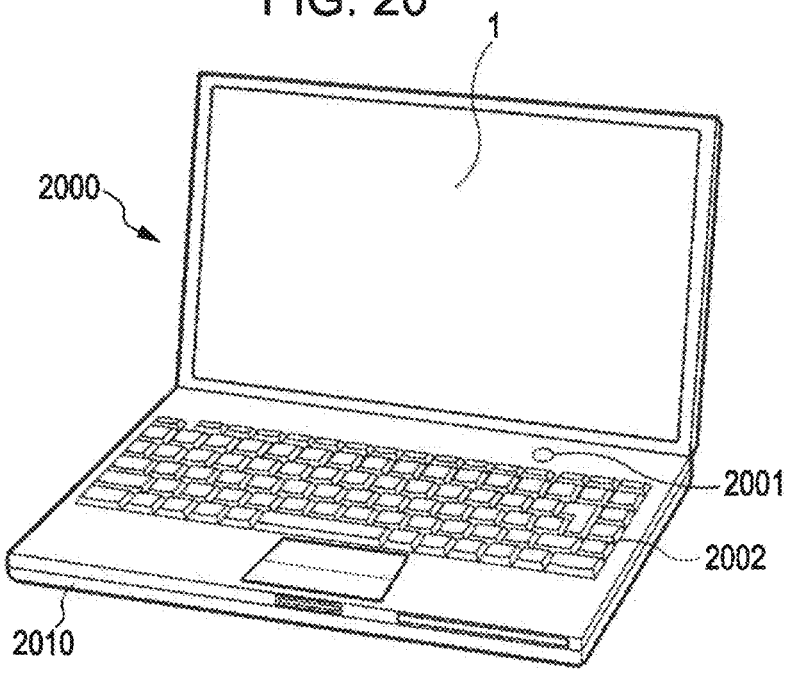
FIG. 20 is a diagram which shows an electronic apparatus (the one) to which the electro-optical device is applied.

FIG. 20 is a diagram which shows the appearance of a personal computer to which the electro-optical device 1 according to the above described embodiment is adopted as a display device. The personal computer 2000 includes the electro-optical device 1 and a main body unit 2010 as a display device. The main body unit 2010 is provided with a power supply switch 2001 and a key board 2002.

When an OLED is used in a light emitting element 150, in the electro-optical device 1, it is possible to display a screen of which viewing angle is wide, and which is easy to view.

Figure 21:
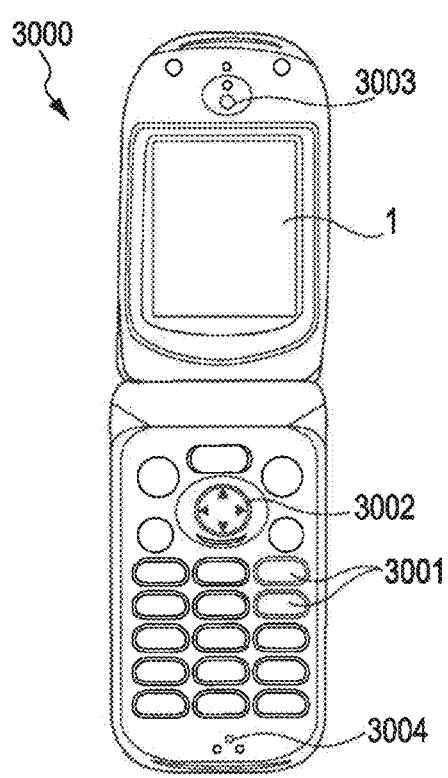
FIG. 21 is a diagram which shows an electronic apparatus (the two) to which the electro-optical device is applied.

FIG. 21 is a diagram which shows the appearance of a mobile phone to which the electro-optical device 1 according to the above described embodiment is adopted as a display device. The mobile phone 3000 includes an ear piece 3003, a mouth piece 3004, and the above described electro-optical device 1, in addition to a plurality of operation buttons 3001, an arrow key 3002, or the like. By operating the arrow key 3002, the screen displayed in the electro-optical device 1 is scrolled.

Figure 22:
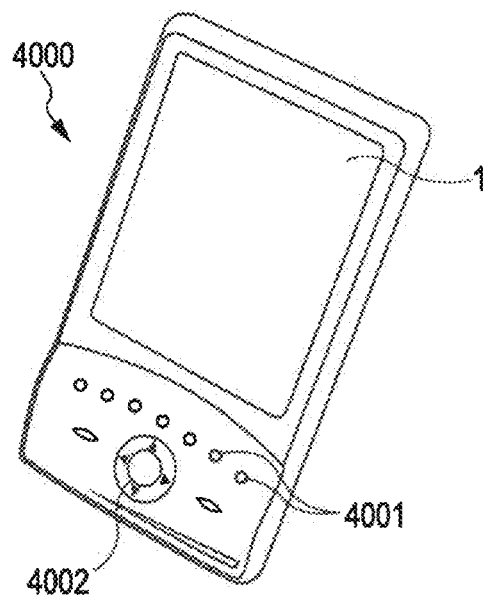
FIG. 22 is a diagram which shows an electronic apparatus (the three) to which the electro-optical device is applied.

FIG. 22 is a diagram which shows the appearance of a PDA (Personal Digital Assistant) to which the electro-optical device 1 is adopted as the display device according to the embodiment of the invention. The PDA 4000 includes the above described electro-optical device 1, in addition to a plurality of operation buttons 4001, an arrow key 4002, or the like. In the PDA 400, a variety of information such as an address book, a diary, or the like, is displayed in the electro-optical device 1 by a predetermined operation, and the displayed information is scrolled according to the operation of the arrow key 4002.

In addition, as electronic apparatuses to which the electro-optical device according to the embodiment of the invention is adopted, for example, there are a television, a car navigation system, a pager, an electronic organizer, electronic paper, a calculator, a word-processor, a work station, a TV phone, a POS terminal, a printer, a scanner, a copy machine, a video player, equipment with a touch panel, or the like, in addition to the equipments exemplified in FIGS. 20 to 22. Particularly, as a micro-display, for example, there are a head-mounted display, a digital still camera, an electronic view finder of a video camera, or the like.

What is claimed is:

1. An electro-optical device comprising:
   a light emitting element;
   a first transistor that controls a current flowing through the light emitting element;
   a holding capacitor, of which one end is connected to a gate of the first transistor;
   a scanning line that is arranged along a first direction;
   a data line that is arranged along a second direction different from the first direction;
   a second transistor of which conduction state is controlled according to a scanning signal which is supplied through the scanning line;
   a shield wire, having, in plan view, (i) a first portion that overlaps the data line and is arranged along the second direction and (ii) a second portion that is arranged along the first direction,
   a first insulating film that is arranged so as to cover the gate of the first transistor; and
   a second insulating film that is arranged so as to cover the first insulating film,
   wherein a shape of the shield wire in plan view is lattice-shaped, and
   the first and second transistors and the holding capacitor are surrounded by a lattice of the shield wire,
   the data line is arranged on the second insulating film, and
   the shield wire is arranged between the first and second insulating films.

2. The electro-optical device according to claim 1, wherein a width of the shield wire is larger than that of the data line.

3. The electro-optical device according to claim 1, wherein the first transistor is connected between the shield wire and the light emitting element.

4. The electro-optical device according to claim 1, further comprising:
   a first relay electrode that connects the data line and the second transistor,
   wherein the first relay electrode is arranged at a position so as to not overlap the shield wire in plan view.

5. The electro-optical device according to claim 1, wherein the first transistor is connected to the light emitting element via a second relay electrode, and
   the shield wire has an open shape in the vicinity of the second relay electrode.

6. An electronic apparatus comprising the electro-optical device according to claim 1.

* * * * *